(12) United States Patent
Kang et al.

(10) Patent No.: US 12,501,613 B2
(45) Date of Patent: Dec. 16, 2025

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Sangmin Kang, Hwaseong-si (KR); Sunggil Kim, Yongin-si (KR); Jeeseung Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 813 days.

(21) Appl. No.: 17/668,889

(22) Filed: Feb. 10, 2022

(65) Prior Publication Data
US 2022/0344368 A1 Oct. 27, 2022

(30) Foreign Application Priority Data
Apr. 27, 2021 (KR) .......................... 10-2021-0054385

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 41/30; H10B 41/35; H10B 43/30; H10B 43/35; H10B 41/40; H10B 41/41;
(Continued)

(56) References Cited

U.S. PATENT DOCUMENTS 9,748,267 B2 8/2017 Zhang et al.
9,824,966 B1 11/2017 Kanakamedala et al.
(Continued)

FOREIGN PATENT DOCUMENTS

KR 10-0714273 B1 5/2007
KR 10-2018-0053918 A 5/2018
KR 10-2020-0052527 A 5/2020

*Primary Examiner* — Britt D Hanley
(74) *Attorney, Agent, or Firm* — Muir Patent Law, PLLC

(57) ABSTRACT

Disclosed are semiconductor devices and electronic systems including the same. The semiconductor device includes a stack structure including electrodes vertically stacked on a semiconductor layer, a source semiconductor pattern between the semiconductor layer and the stack structure, a support semiconductor pattern between the stack structure and the source semiconductor pattern, and a vertical structure penetrating the stack structure, the support semiconductor pattern, and the source semiconductor pattern. The vertical structure includes a vertical channel pattern in which a part of a sidewall is in contact with the source semiconductor pattern. The vertical channel pattern includes an upper portion adjacent to the stack structure, a lower portion adjacent to the source semiconductor pattern, and a middle portion adjacent to the support semiconductor pattern. The upper portion has a first diameter. The lower portion has a second diameter. The middle portion has a third diameter less than the first and second diameters.

16 Claims, 29 Drawing Sheets

(51) Int. Cl.
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC ............. *H10B 41/40* (2023.02); *H10B 43/10* (2023.02); *H10B 43/35* (2023.02); *H10B 43/40* (2023.02)

(58) Field of Classification Search
CPC ........ H10B 43/23; H10B 43/27; H10B 41/23; H10B 41/27; H10B 41/50; H10B 43/50; H10B 43/10; H10B 43/40; H01L 29/66477; H01L 29/66833; H01L 29/792; H01L 29/7926
See application file for complete search history.

(56) References Cited

U.S. PATENT DOCUMENTS

| | | |
|---|---|---|
| 10,224,340 B2 | 3/2019 | Hada et al. |
| 10,367,003 B2 | 7/2019 | Kang et al. |
| 10,804,291 B1 | 10/2020 | Rajashekhar et al. |
| 2018/0138195 A1 | 5/2018 | Lee |
| 2020/0395379 A1 | 12/2020 | Lee et al. |
| 2021/0305276 A1* | 9/2021 | Kim ........................ H10B 41/27 |
| 2022/0045091 A1* | 2/2022 | Cui ................... H01L 21/32135 |
| 2022/0045097 A1* | 2/2022 | Choi ...................... H10B 43/10 |

* cited by examiner

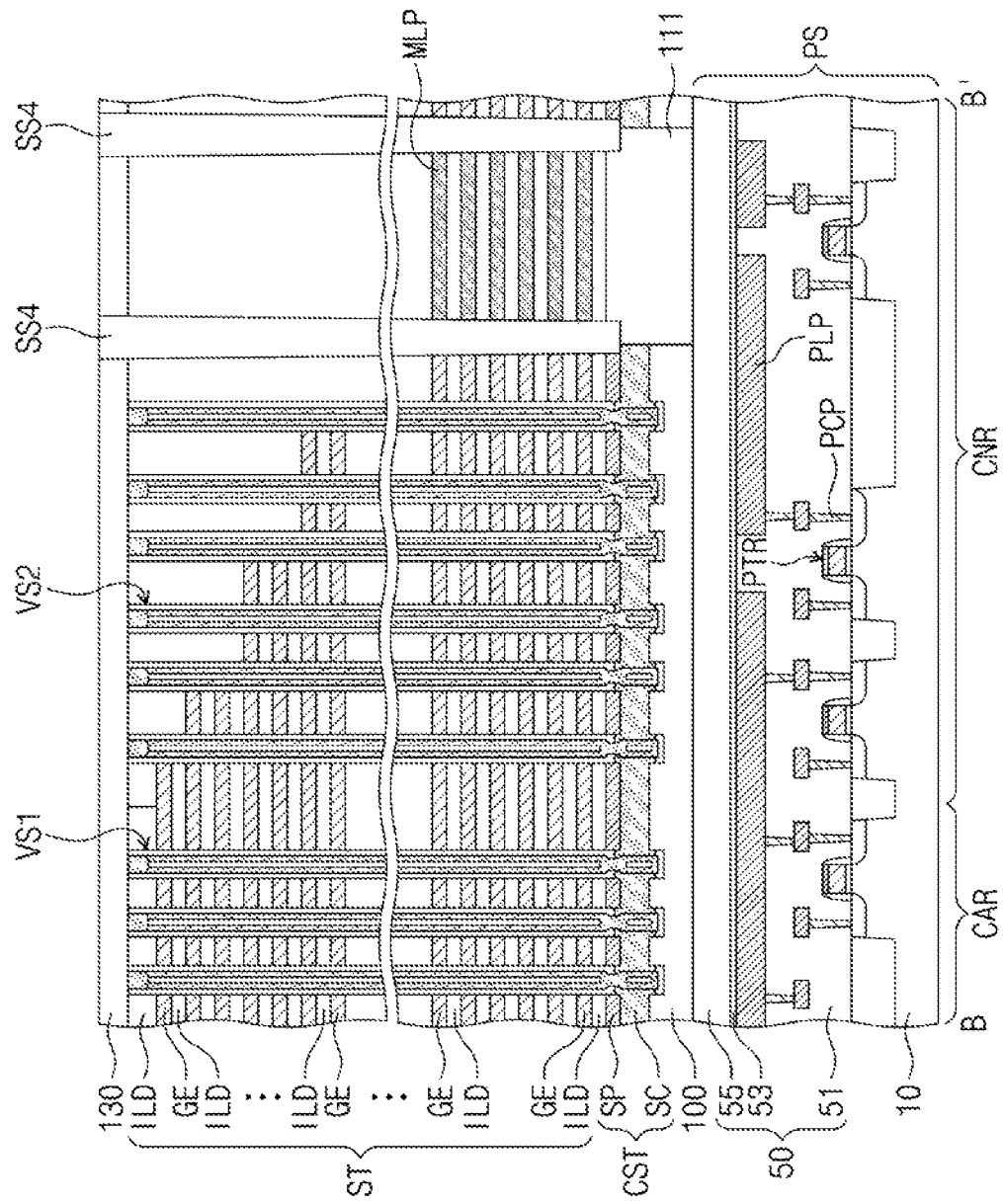

SEMICONDUCTOR DEVICE AND ELECTRONIC SYSTEM INCLUDING THE SAME

CROSS-REFERENCE TO RELATED APPLICATION

This U.S. nonprovisional application claims priority under 35 U.S.C. § 119 to Korean Patent Application No. 10-2021-0054385 filed on Apr. 27, 2021, in the Korean Intellectual Property Office, the disclosure of which is hereby incorporated by reference in its entirety.

BACKGROUND

1. Field

Embodiments relate to a semiconductor device and an electronic system including the same.

2. Description of the Related Art

A semiconductor device may be used to store a large amount of data in an electronic system. Thus, studies have been conducted to increase data storage capacity of the semiconductor device. For example, as an approach to increase data storage capacity of the semiconductor device, a semiconductor device is suggested to include three-dimensionally arranged memory cells instead of two-dimensionally arranged memory cells.

SUMMARY

Embodiments are directed to a semiconductor device, including: a stack structure that includes a plurality of electrodes vertically stacked on a semiconductor layer; a source semiconductor pattern between the semiconductor layer and the stack structure; a support semiconductor pattern between the stack structure and the source semiconductor pattern; and a vertical structure penetrating the stack structure, the support semiconductor pattern, and the source semiconductor pattern. The vertical structure may include a vertical channel pattern in which a part of a sidewall is in contact with the source semiconductor pattern. The vertical channel pattern may include: an upper portion adjacent to the stack structure; a lower portion adjacent to the source semiconductor pattern; and a middle portion adjacent to the support semiconductor pattern. The upper portion may have a first diameter. The lower portion may have a second diameter. The middle portion may have a third diameter less than the first diameter and the second diameter.

Embodiments are directed to a semiconductor device, including: a stack structure including a plurality of electrodes vertically stacked on a semiconductor layer; a source semiconductor pattern between the semiconductor layer and the stack structure; a support semiconductor pattern between the stack structure and the source semiconductor pattern; and a vertical structure penetrating the stack structure, the support semiconductor pattern, and the source semiconductor pattern. The vertical structure may include: a vertical channel pattern in which a part of a sidewall is in contact with the source semiconductor pattern; and a data storage pattern on the source semiconductor pattern, the data storage pattern surrounding the sidewall of the vertical channel pattern. The data storage pattern may include: a first portion between the vertical channel pattern and a sidewall of the stack structure; and a second portion between the vertical channel pattern and a sidewall of the support semiconductor pattern. A thickness of the second portion may be greater than a thickness of the first portion.

Embodiments are directed to a semiconductor device, including: a peripheral circuit structure including a plurality of peripheral circuits integrated on a semiconductor substrate; a semiconductor layer on the peripheral circuit structure, the semiconductor layer including a cell array region and a connection region; a stack structure including a plurality of electrodes vertically stacked on the semiconductor layer, the stack structure having a stepwise structure on the connection region; a source semiconductor pattern between the semiconductor layer and the stack structure; a support semiconductor pattern between the stack structure and the source semiconductor pattern; a first vertical structure penetrating the stack structure, the support semiconductor pattern, and the source semiconductor pattern on the cell array region, the first vertical structure including a first vertical channel pattern in which a part of a sidewall is in contact with the source semiconductor pattern, and a first data storage pattern on the source semiconductor pattern, the first data storage pattern surrounding the sidewall of the first vertical channel pattern; a plurality of second vertical structures penetrating the stack structure, the support semiconductor pattern, and the source semiconductor pattern on the connection region, the second vertical structure including a second vertical channel pattern in which a part of a sidewall is in contact with the source semiconductor pattern, and a second data storage pattern on the source semiconductor pattern, the second data storage pattern surrounding the sidewall of the second vertical channel pattern; and a bit line that runs across the stack structure on the cell array region, the bit line being connected to the first vertical structure. Each of the first and second vertical channel patterns may include: an upper portion adjacent to the stack structure; a lower portion adjacent to the source semiconductor pattern; and a middle portion adjacent to the support semiconductor pattern. The first vertical channel pattern may have a minimum diameter at the middle portion.

Embodiments are directed to an electronic system, including: a semiconductor device including a stack structure including a plurality of electrodes vertically stacked on a semiconductor layer, a source semiconductor pattern between the semiconductor layer and the stack structure, a support semiconductor pattern between the stack structure and the source semiconductor pattern, and a vertical structure penetrating the stack structure, the support semiconductor pattern, and the source semiconductor pattern, the vertical structure including a vertical channel pattern in which a part of a sidewall is in contact with the source semiconductor pattern; and a controller electrically connected through an input/output pad to the semiconductor device, the controller controlling the semiconductor device. The vertical channel pattern may include: an upper portion adjacent to the stack structure; a lower portion adjacent to the source semiconductor pattern; and a middle portion adjacent to the support semiconductor pattern. The vertical channel pattern may have a minimum diameter at the middle portion.

BRIEF DESCRIPTION OF THE DRAWINGS

Features will become apparent to those of skill in the art by describing in detail example embodiments with reference to the attached drawings in which:

FIGS. 12A to 16A illustrate cross-sectional views taken along line A-A' of FIG. 5 and FIGS. 12B to 16B illustrate cross-sectional views taken along line B-B' of FIG. 5 showing a method of fabricating a three-dimensional semiconductor memory device according to an example embodiment.

DETAILED DESCRIPTION

Figure 1:
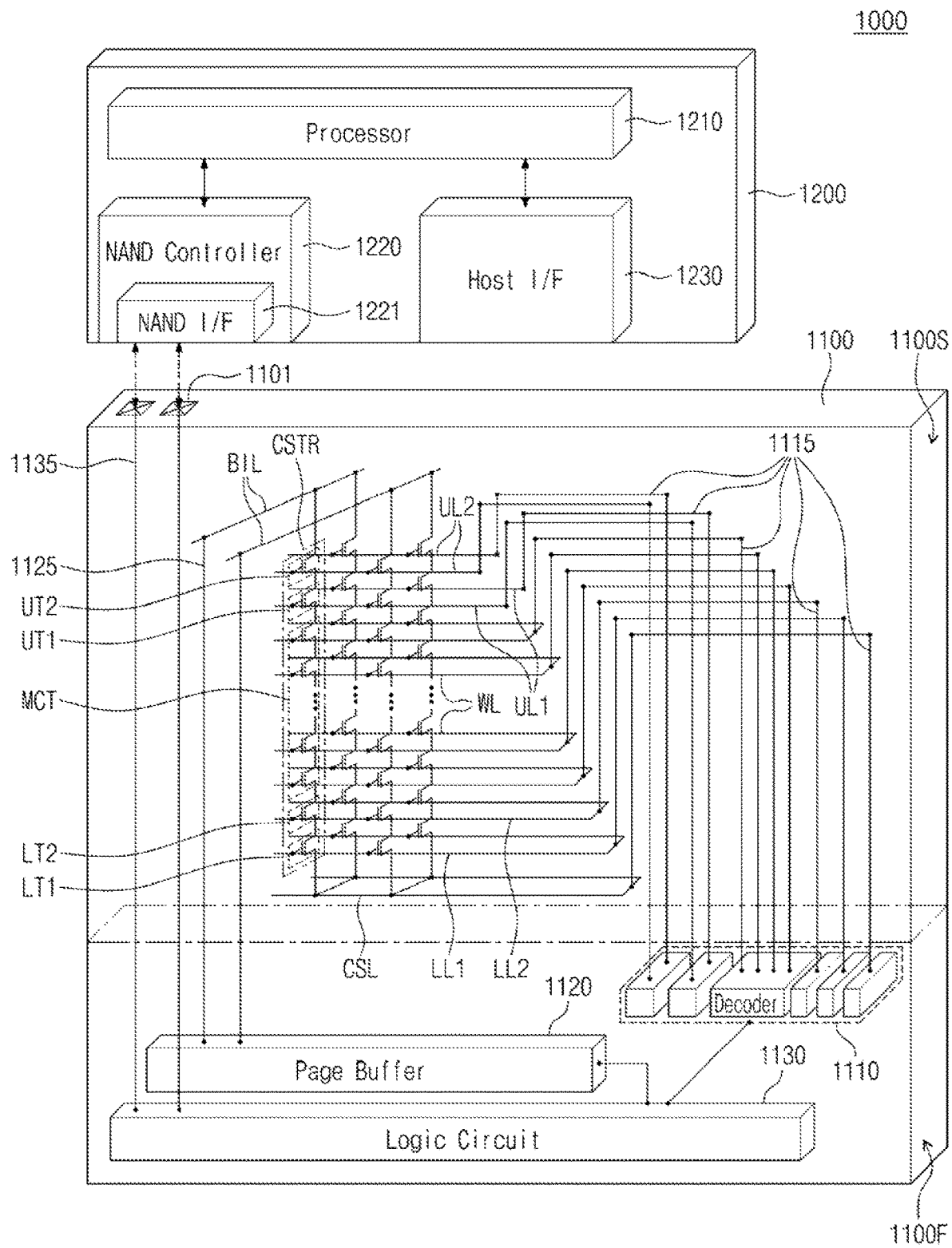
FIG. 1 illustrates a simplified schematic diagram showing an electronic system that includes a semiconductor device according to an example embodiment.

FIG. 1 illustrates a simplified schematic diagram showing an electronic system that includes a semiconductor device according to an example embodiment.

Referring to FIG. 1, an electronic system 1000 according to an example embodiment may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S on the first structure 1100F. The first structure 1100F may be disposed on a side of the second structure 1100S.

The first structure 1100F may be a peripheral circuit structure that includes a decoder circuit 1110, a page buffer 1120, and a logic circuit 1130.

The second structure 1100S may be a memory cell structure that includes bit lines BIL, a common source line CSL, word lines WL, first and second gate upper lines UL1 and UL2, first and second gate lower lines LL1 and LL2, and memory cell strings CSTR between the bit line BIL and the common source line CSL. Each of the memory cell strings CSTR may include lower transistors LT1 and LT2 adjacent to the common source line CSL, upper transistors UT1 and UT2 adjacent to the bit line BIL, and memory cell transistors MCT disposed between the lower transistors LT1 and LT2 and the upper transistors UT1 and UT2. The number of the lower transistors LT1 and LT2 and of the upper transistors UT1 and UT2 may be variously changed.

The upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BIL may be electrically connected to the page buffer 1120 through second connection lines 1125 that extend from the first structure 1100F toward the second structure 1100S.

For the first structure 1100F, the decoder circuit 1110 and the page buffer 1120 may perform a control operation to at least one selected memory cell transistor among the plurality of memory cell transistors MCT. A logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

Although not shown, the first structure 1100F may include a voltage generator. The voltage generator may produce program voltages, read voltages, pass voltages, and verification voltages that are used for operating the memory cell strings CSTR. The program voltage may be relatively higher (e.g., about 20 V to about 40 V) than the read voltage, the pass voltage, and the verification voltage. The first structure 1100F may include high-voltage transistors and low-voltage transistors. The decoder circuit 1110 may include pass transistors connected to the word lines WL of the memory cell strings CSTR. The pass transistors may include high-voltage transistors capable of withstanding high voltages such as program voltages applied to the word lines WL in a program operation. The page buffer 1120 may also include high-voltage transistors capable of withstanding high voltages.

The controller 1200 may include a processor 1210, a NAND controller 1220, and a host interface (I/F) 1230. The electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate based on predetermined firmware, and may control the NAND controller 1220 to access the semiconductor device 1100.

The NAND controller 1220 may include a NAND interface 1221 that processes communication with the semiconductor device 1100. The NAND interface 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100.

The host interface 1230 may provide the electronic system 1000 with communication with an external host. When a control command is received through the host interface 1230 from an external host, the semiconductor device 1100 may be controlled by the processor 1210 in response to the control command.

Figure 2:
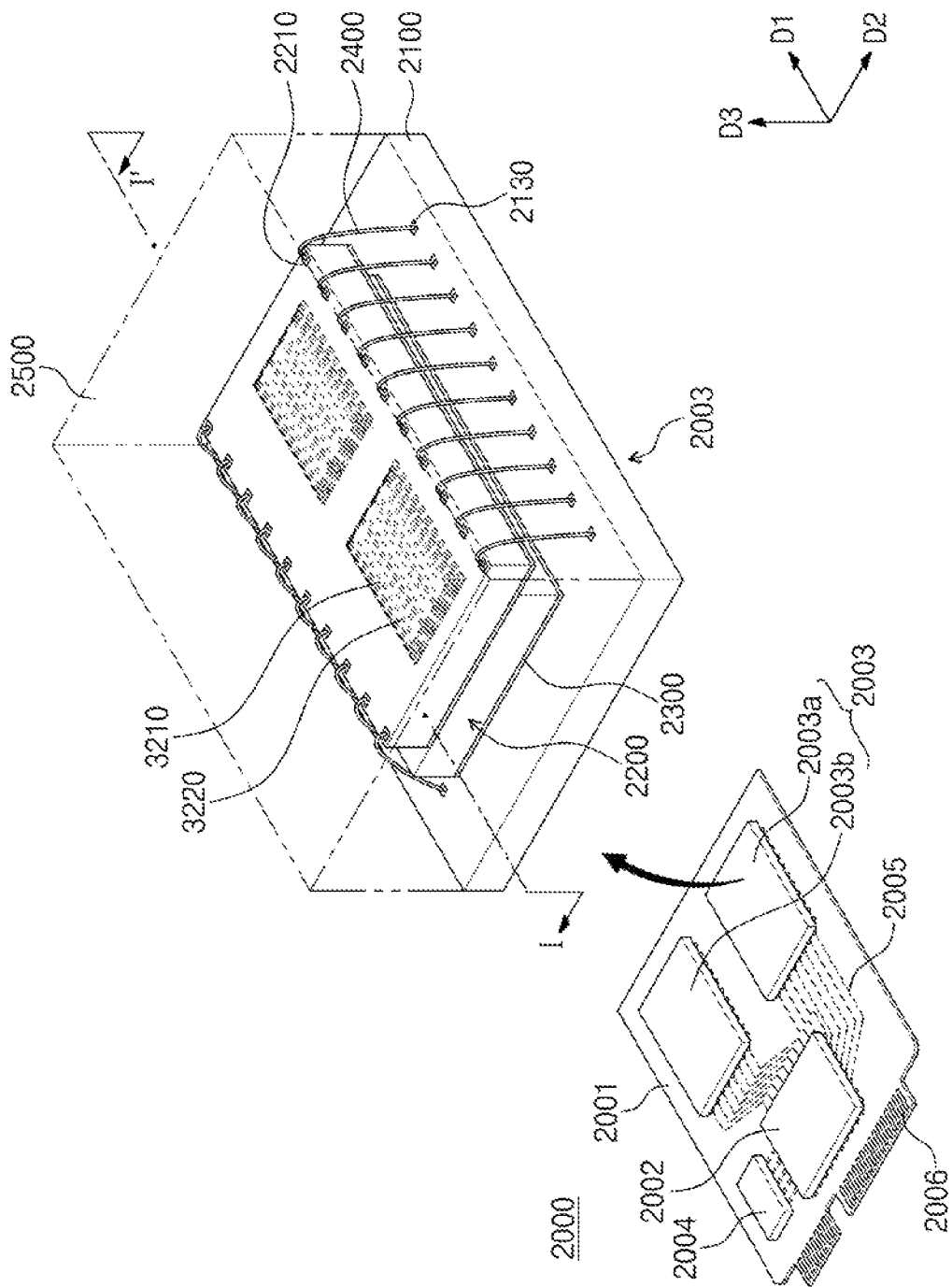
FIG. 2 illustrates a simplified perspective view showing an electronic system that includes a semiconductor device according to an example embodiment.

FIG. 2 illustrates a simplified perspective view showing an electronic system that includes a semiconductor device according to an example embodiment.

Referring to FIG. 2, an electronic system 2000 according to an example embodiment may include a main board 2001, and a controller 2002, at least one semiconductor package 2003, and a dynamic random access memory (DRAM) 2004 that are mounted on the main board 2001. The semiconductor package 2003 and the DRAM 2004 may be connected to the controller 2002 through wiring patterns 2005 formed on the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. The electronic system 2000 may communicate with the external host through one or more interfaces, e.g., universal serial bus (USB), peripheral component interconnect express (PIC-Express), serial advanced technology attachment (SATA), and/or M-PHY for universal flash storage (UFS). The electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include a NAND controller for controlling the semiconductor package 2003 and a DRAM controller for controlling the DRAM 2004.

The semiconductor package 2003 may include first and second semiconductor packages 2003*a* and 2003*b* that are spaced apart from each other. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesive layers 2300 disposed on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be an integrated circuit board including upper pads 2130. Each of the semiconductor chips 2200 may include one or more input/output pads 2210. The input/output pad 2210 may correspond to the input/output pad 1101 of FIG. 1. Each of the semiconductor chips 2200 may include stack structures 3210 and vertical structures 3220. Each of the semiconductor chips 2200 may include a semiconductor device according to an example embodiment which will be discussed below.

The connection structures 2400 may be bonding wires that electrically connect the input/output pads 2210 to the upper pads 2130. Thus, on each of the first and second semiconductor packages 2003*a* and 2003*b*, the semiconductor chips 2200 may be electrically connected to each other in a wire bonding manner, and may be electrically connected to the upper pads 2130 of the package substrate 2100. In another implementation, on each of the first and second semiconductor packages 2003*a* and 2003*b*, the semiconductor chips 2200 may be electrically connected to each other through connection structures such as through silicon vias instead of the connection structures 2400.

The controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 3:
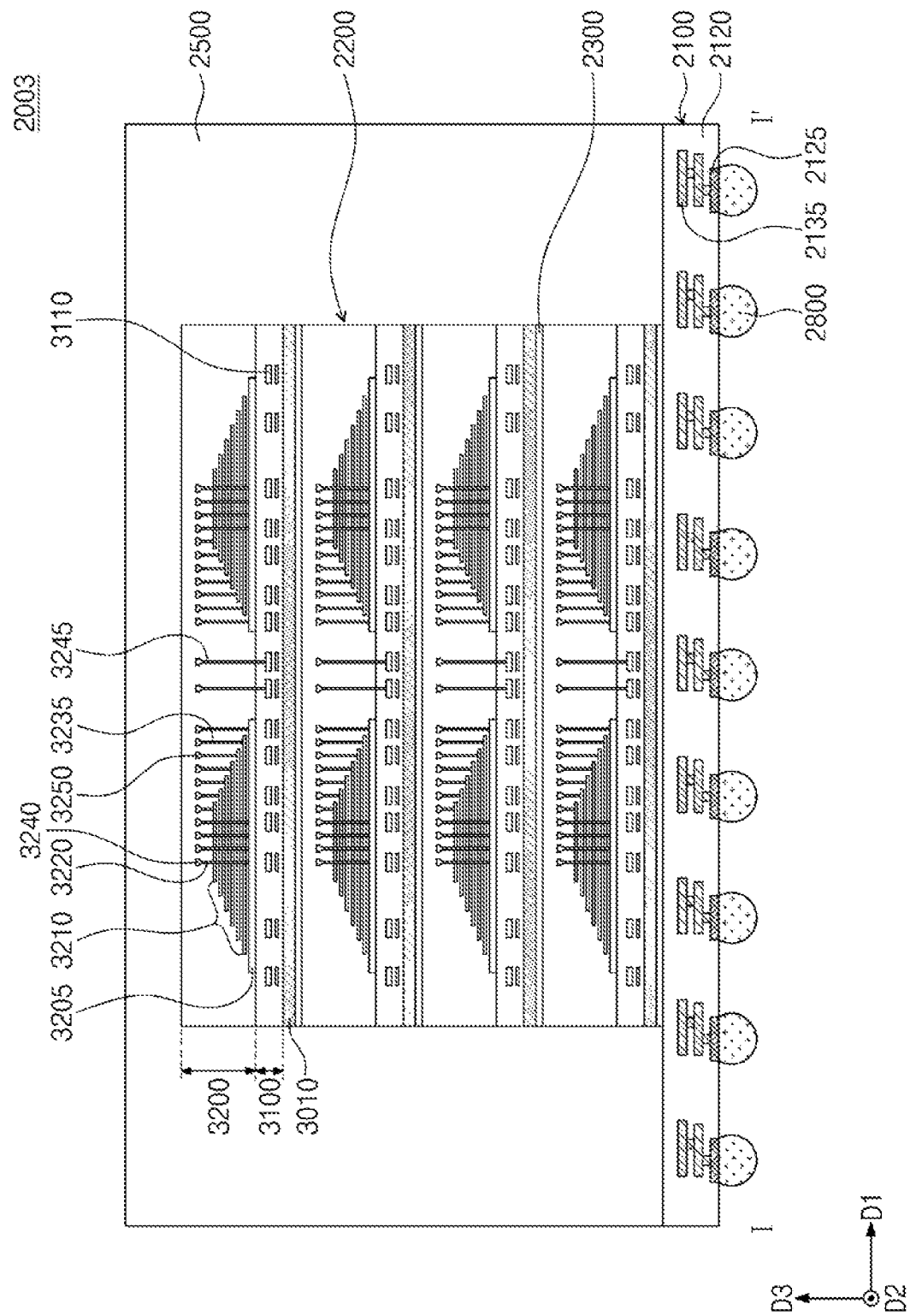
FIGS. 3 and 4 illustrate simplified cross-sectional views showing semiconductor packages according to example embodiments.
Figure 4:
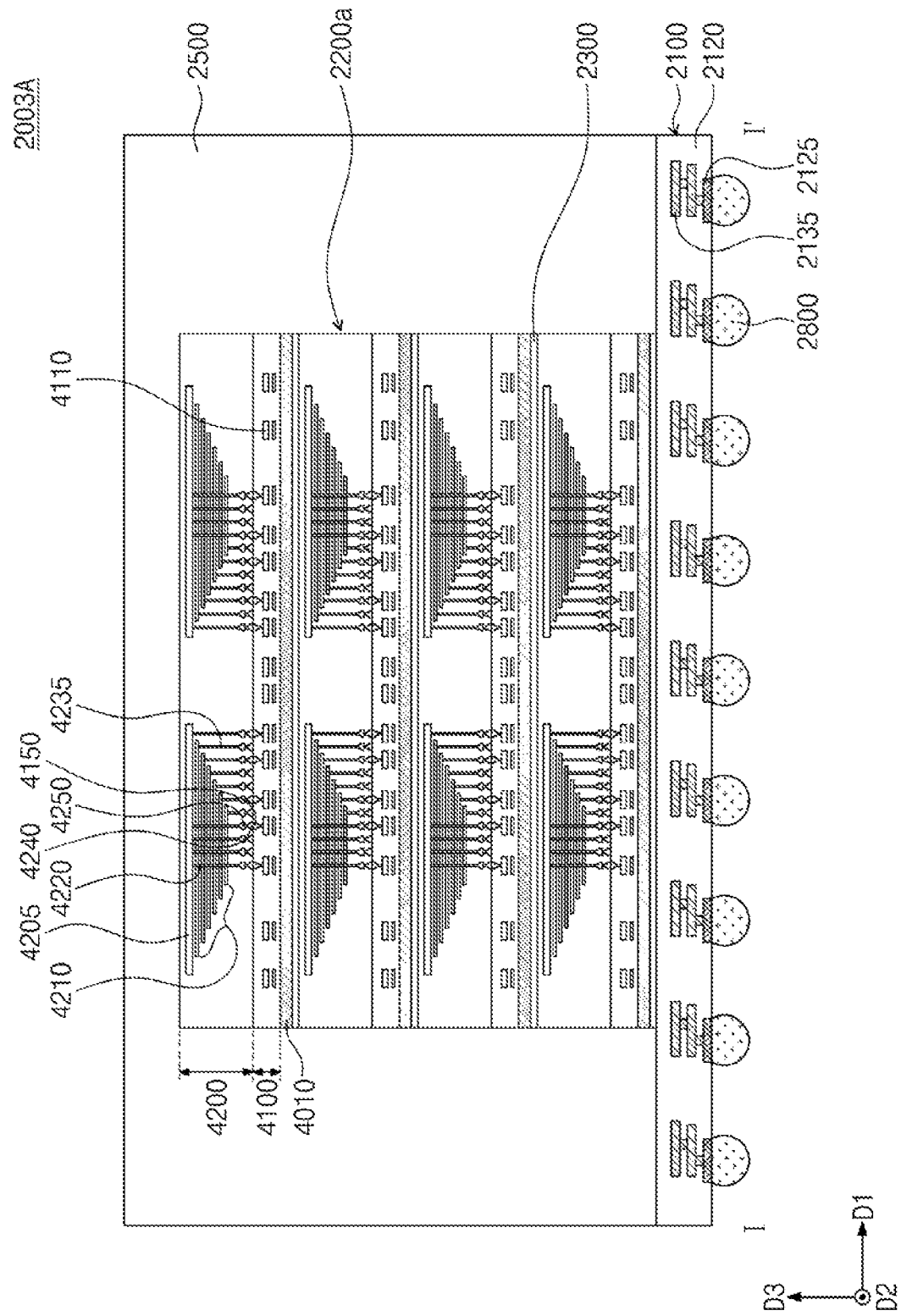

FIGS. 3 and 4 illustrate simplified cross-sectional views showing semiconductor packages according to example embodiments. FIGS. 3 and 4 each depict an example of the semiconductor package illustrated in FIG. 2, conceptually showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, upper pads (see 2130 of FIG. 2) disposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The upper pads 2130 may be electrically connected to the connection structures 2400. The lower pads 2125 may be connected through conductive connectors 2800 to the wiring patterns 2005 of the main board 2001 in the electronic system 2000, referring to FIGS. 2 and 3.

Each of the semiconductor chips 2200 may include a semiconductor substrate 3010, and a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 and separation structures that penetrate the stack structure 3210, bit lines 3240 electrically connected to the vertical structures 3220, and cell contact plugs 3235 electrically connected to the word lines (see WL of FIG. 1) of the stack structure 3210. Each of the first structure 3100, the second structure 3200, and the semiconductor chips 2200 may further include separation structures which will be discussed below.

Each of the semiconductor chips 2200 may include one or more through lines 3245 that have electrical connection with the peripheral wiring lines 3110 of the first structure 3100 and extend into the second structure 3200. The through line 3245 may be disposed outside the stack structure 3210 and may further be disposed to penetrate the stack structure 3210. Each of the semiconductor chips 2200 may further include one or more input/output pads (see 2210 of FIG. 2) electrically connected to the peripheral wiring lines 3110 of the first structure 3100.

Referring to FIG. 4, a semiconductor package 2003A may be configured such that each of semiconductor chips 2200a may include a semiconductor substrate 4010, a first structure 4100 on the semiconductor substrate 4010, and a second structure 4200 disposed on and wafer-bonded to the first structure 4100.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 and a separation structure that penetrate the stack structure 4210, and second bonding structures 4250 electrically connected to the vertical structures 4220 and word lines (see WL of FIG. 1) of the stack structure 4210. For example, the second bonding structures 4250 may be electrically connected to the vertical structures 4220 through bit lines 4240 electrically connected to the vertical structures 4220, and may also be electrically connected to the word lines (see WL of FIG. 1) through cell contact plugs 4235 electrically connected to the word lines (see WL of FIG. 1). The first bonding structures 4150 of the first structure 4100 and the second bonding structures 4250 of the second structure 4200 may be coupled to each other while being in contact with each other. The first and second bonding structures 4150 and 4250 may have their bonding portions formed of, e.g., copper (Cu).

Each of the first structure 4100, the second structure 4200, and the semiconductor chip 2200a may further include a source structure which will be discussed below. Each of the semiconductor chips 2200a may further include one or more input/output pads (see 2210 of FIG. 2) electrically connected to the peripheral wiring lines 4110.

The semiconductor chips 2200 of FIG. 3 may be electrically connected to each other through the connection structures (see 2400 of FIG. 2), e.g., bonding wires, and this may also be applicable to the semiconductor chips 2200a of FIG. 4. In another implementation, semiconductor chips, such as the semiconductor chips 2200 of FIG. 3 or the semiconductor chips 2200a of FIG. 4, in a single semiconductor package may be electrically connected to each other through one or more connection structures that include through electrodes such as through silicon vias (TSV).

The first structure 3100 of FIG. 3 and the first structure 4100 of FIG. 4 may correspond to a peripheral circuit structure which will be discussed below, and the second structure 3200 of FIG. 3 and the second structure 4200 of FIG. 4 may correspond to a cell array structure which will be discussed below.

Figure 5:
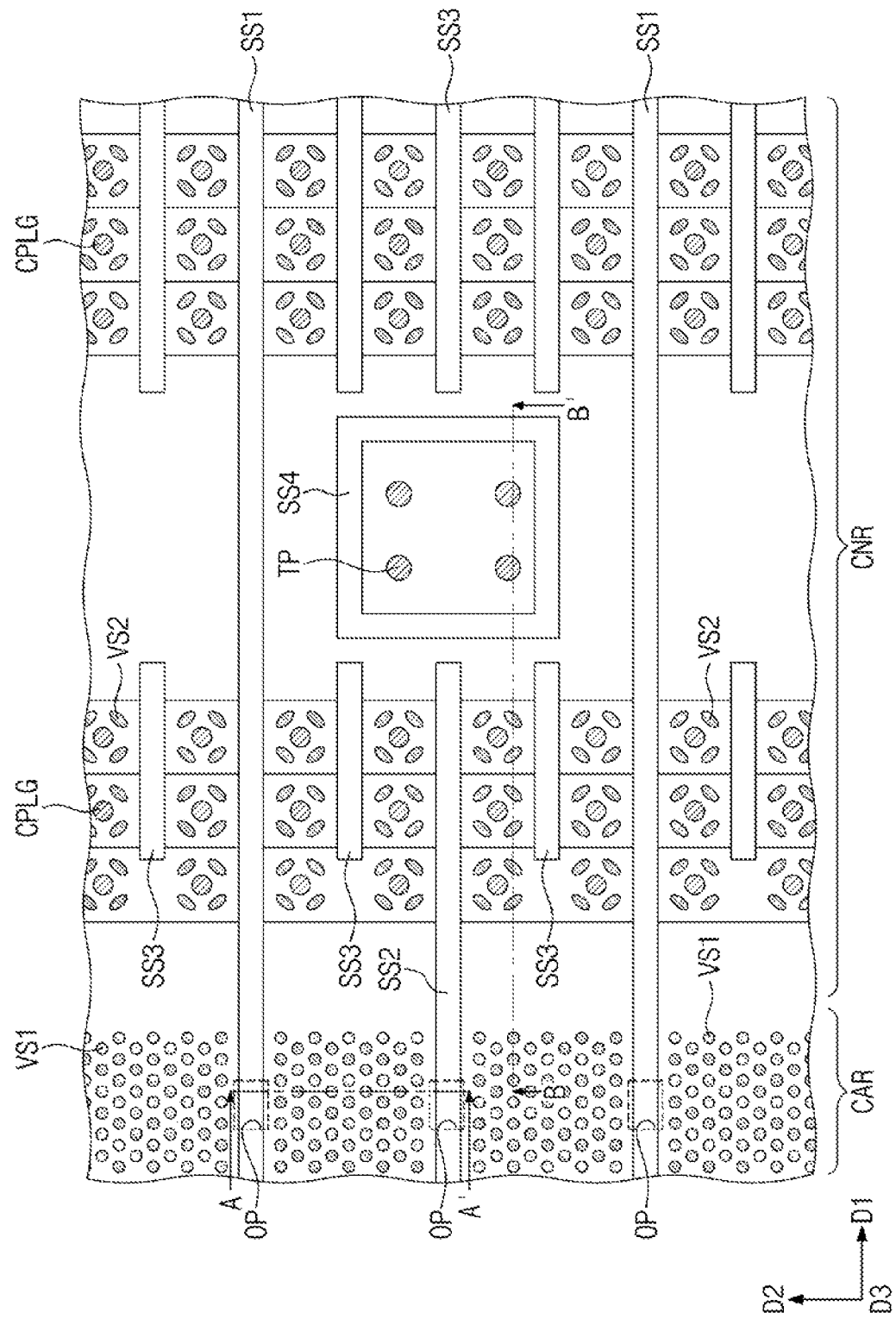
FIG. 5 illustrates a plan view showing a three-dimensional semiconductor memory device according to an example embodiment.
Figure 6A:
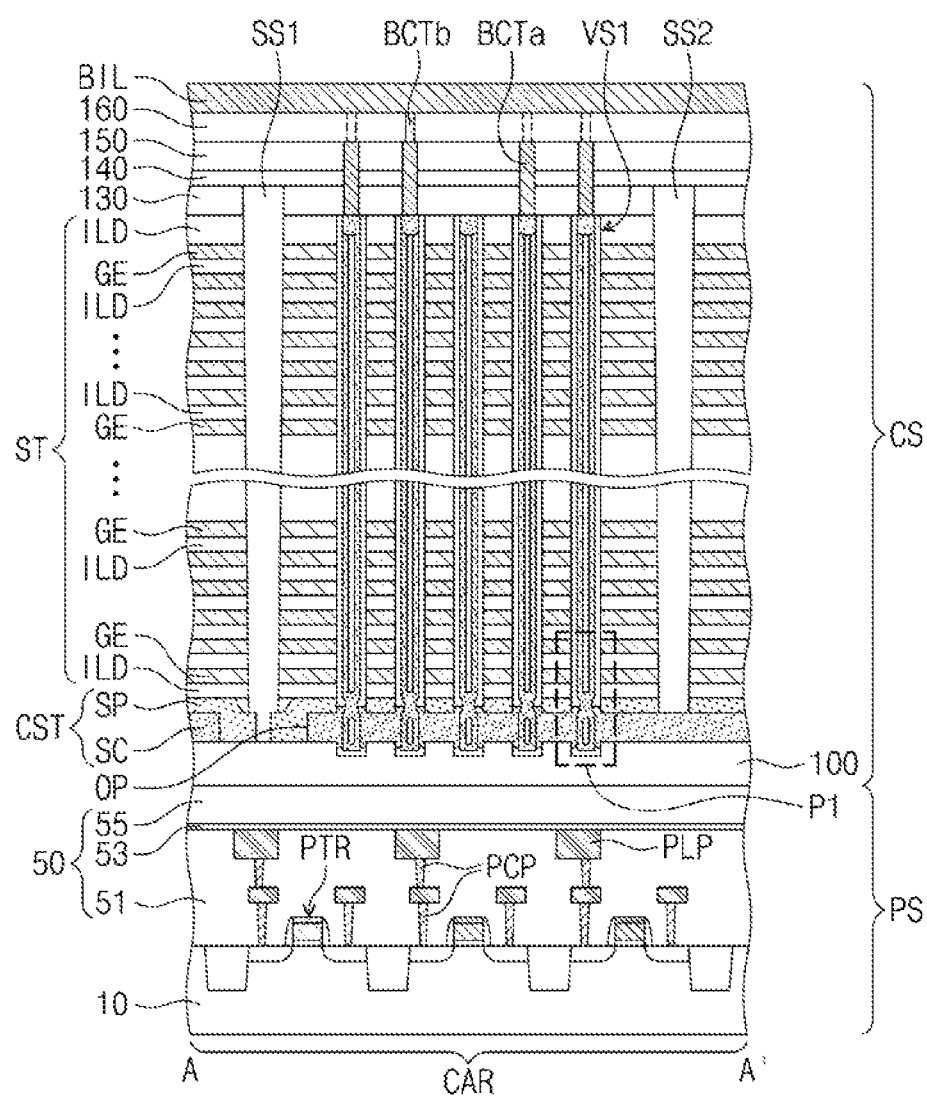
FIGS. 6A and 6B illustrate cross-sectional views respectively taken along lines A-A' and B-B' of FIG. 5, showing a three-dimensional semiconductor memory device according to an example embodiment.
Figure 6B:
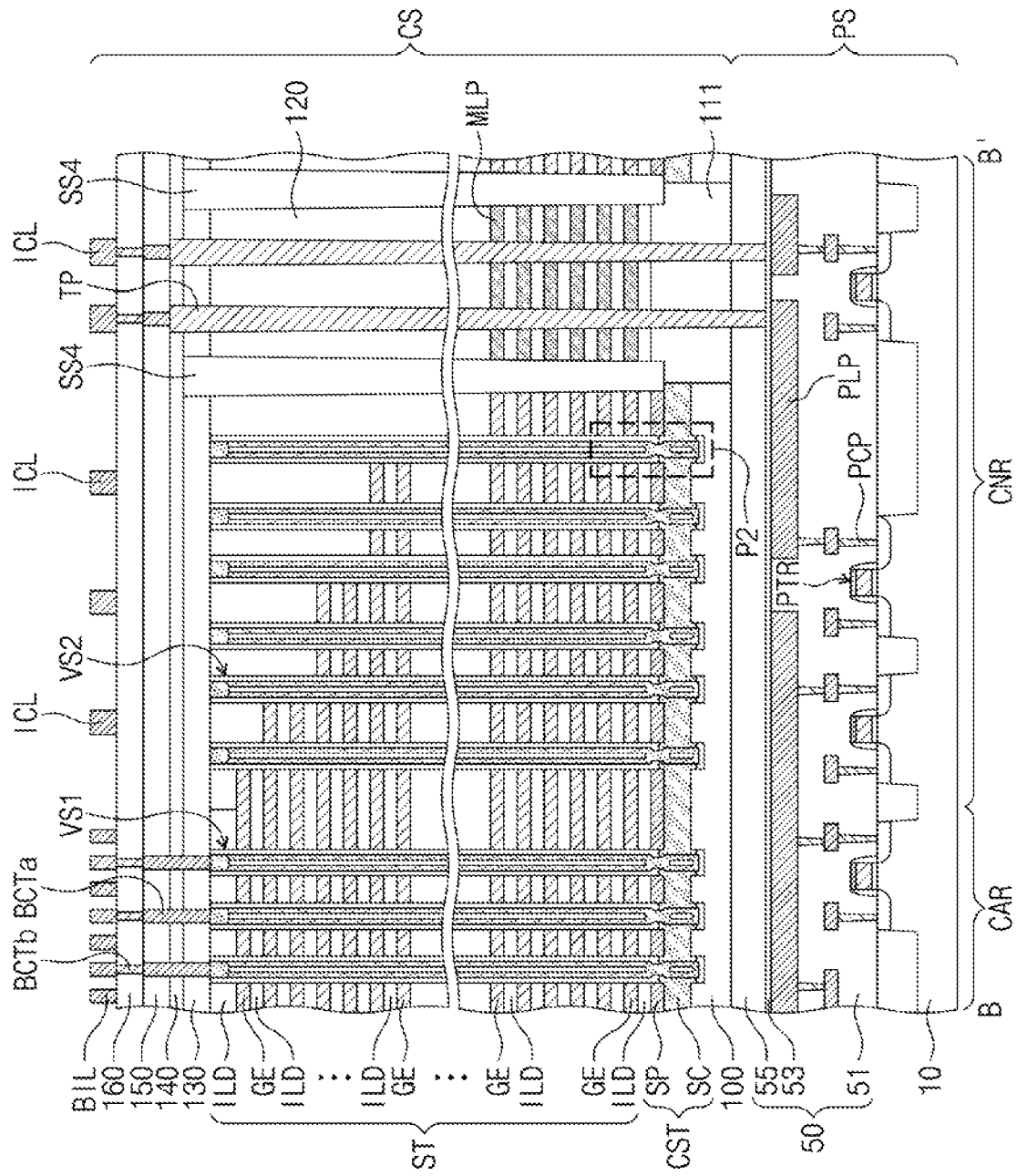
Figure 7:
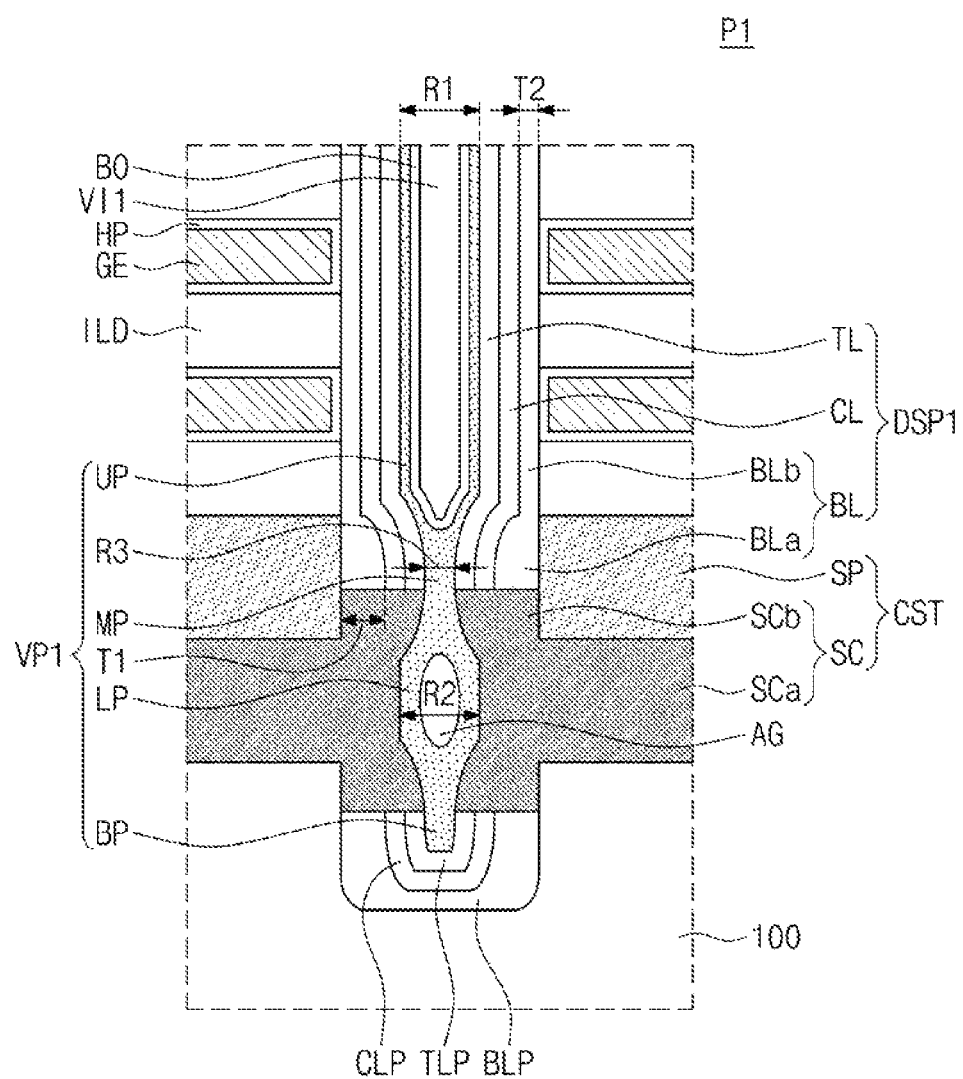
FIGS. 7 and 8 illustrate enlarged views showing section P1 of FIG. 6A.
Figure 8:
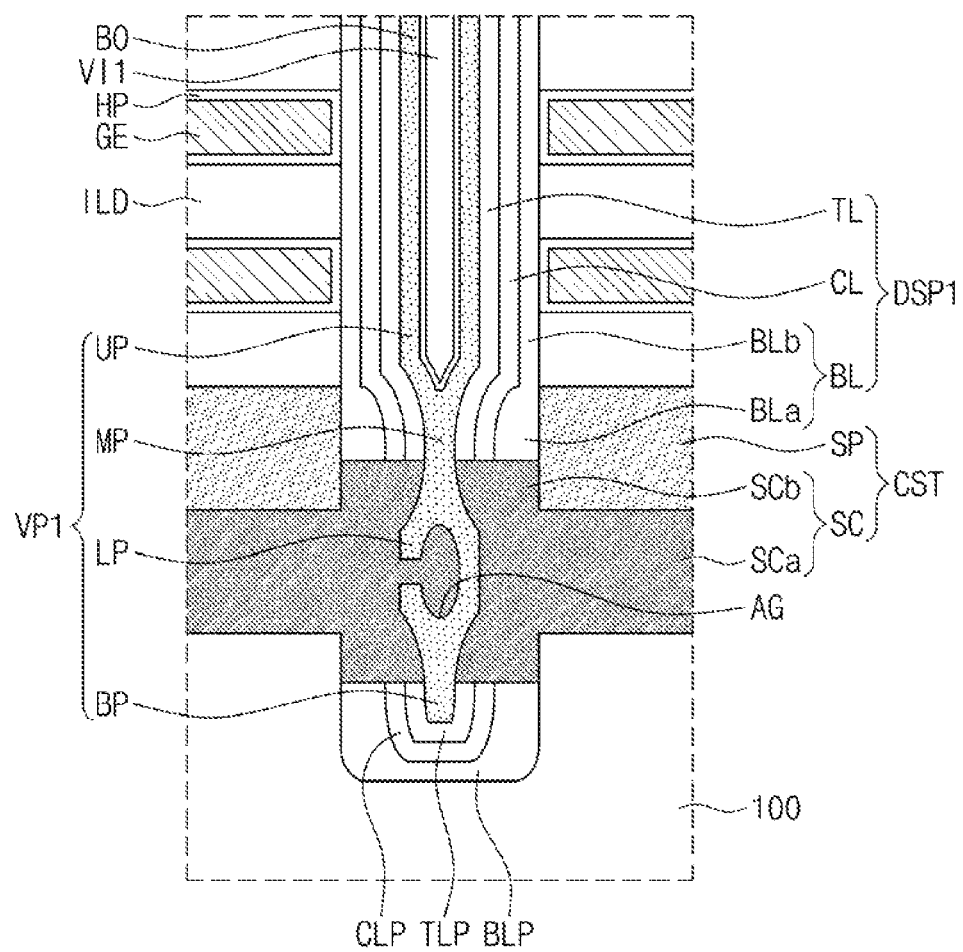
Figure 9:
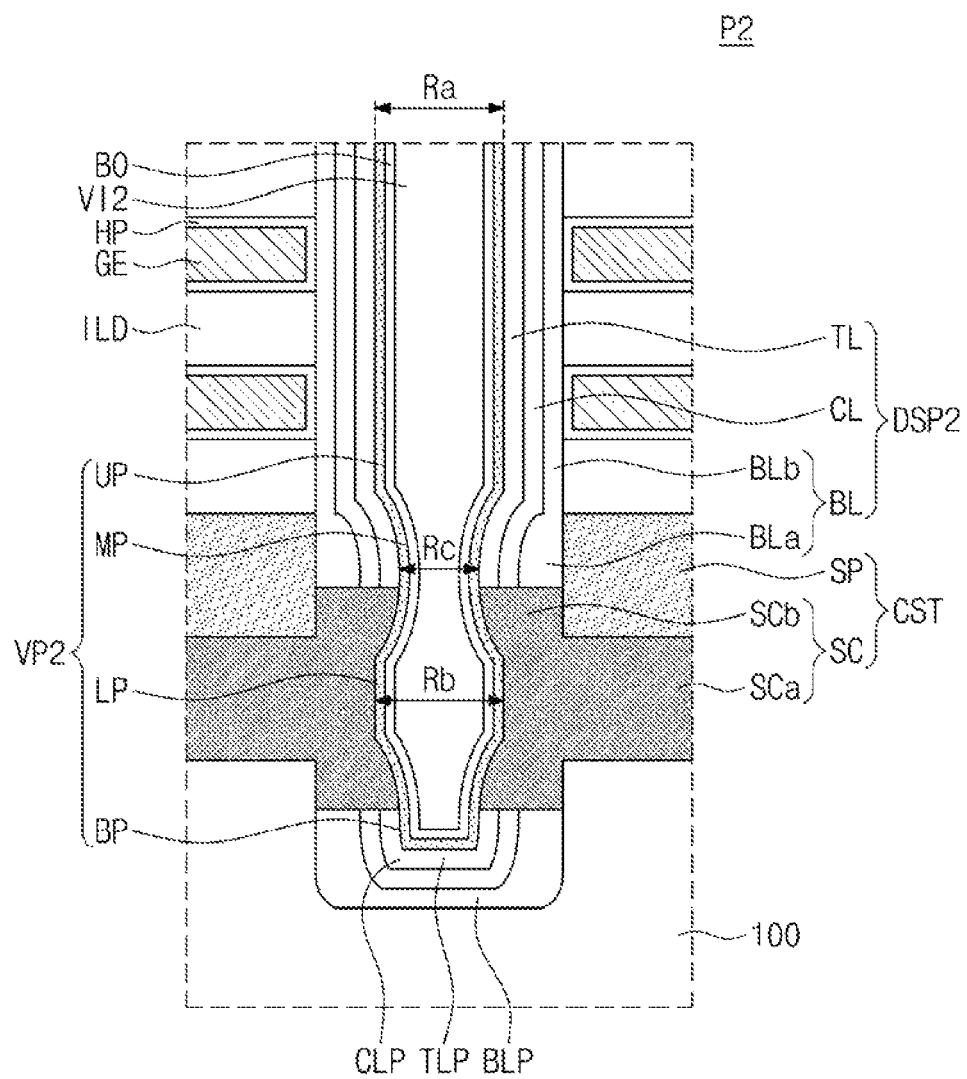
FIGS. 9 and 10 illustrate enlarged views showing section P2 of FIG. 6B.
Figure 10:
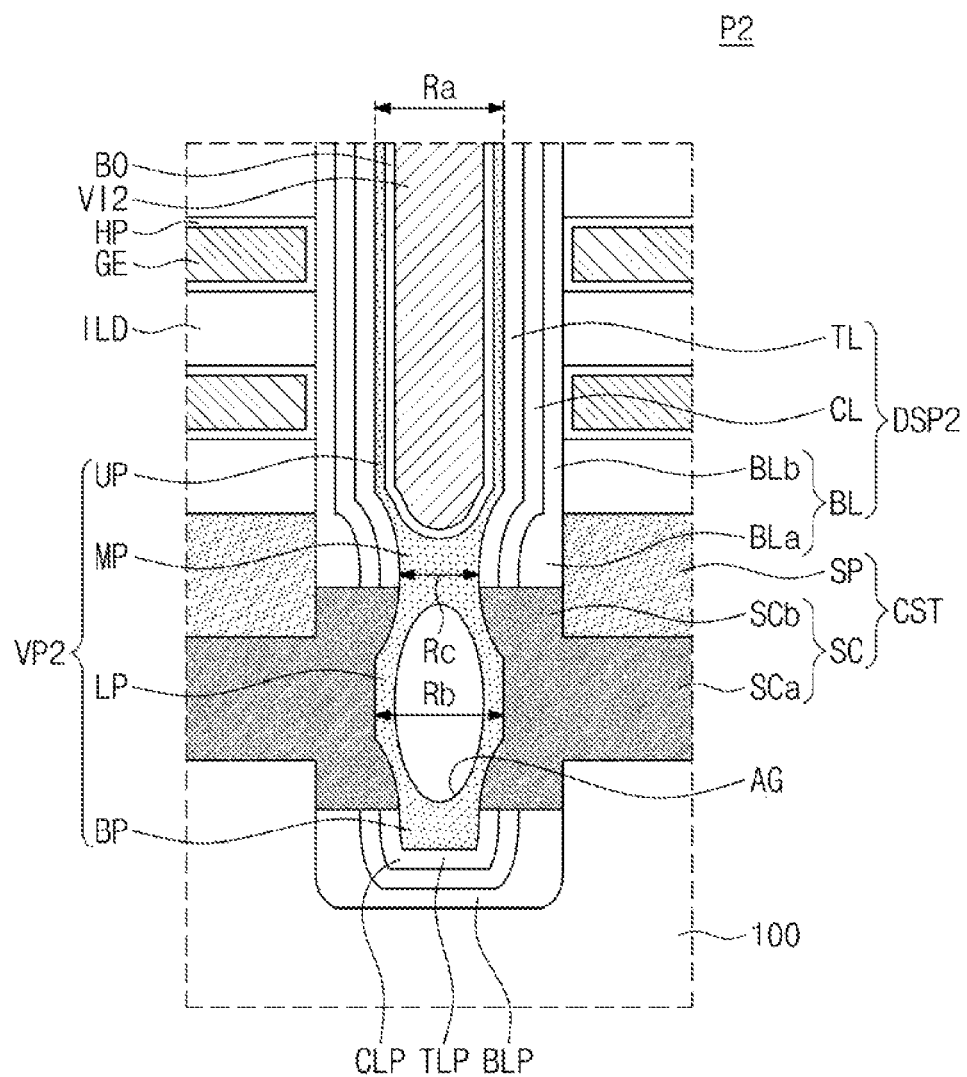

FIG. 5 illustrates a plan view showing a three-dimensional semiconductor memory device according to an example embodiment. FIGS. 6A and 6B illustrate cross-sectional views respectively taken along lines A-A' and B-B' of FIG. 5, showing a three-dimensional semiconductor memory device according to an example embodiment. FIGS. 7 and 8 illustrate enlarged views showing section P1 of FIG. 6A. FIGS. 9 and 10 illustrate enlarged views showing section P2 of FIG. 6B.

Referring to FIGS. 5, 6A, and 6B, a semiconductor device according to an example embodiment may include a peripheral circuit structure PS and a cell array structure CS on the peripheral circuit structure PS.

The peripheral circuit structure PS may include peripheral circuits PTR integrated on an entire surface of a semiconductor substrate 10 and a lower interlayer dielectric layer 50 that covers the peripheral circuits PTR.

The semiconductor substrate 10 may have a cell array region CAR and a connection region CNR, in which cell array and connection regions CAR and CNR may be disposed along a first direction D1. The semiconductor substrate 10 may be a silicon substrate.

The peripheral circuits PTR may be row and column decoders, a page buffer, and a control circuit. The peripheral circuits PTR may include NMOS and PMOS transistors. Peripheral circuit lines PLP may be electrically connected to the peripheral circuits PTR through peripheral contact plugs PCP.

The lower interlayer dielectric layer 50 may be provided on the entire surface of the semiconductor substrate 10. On the semiconductor substrate 10, the lower interlayer dielectric layer 50 may cover the peripheral circuits PTR, the peripheral contact plugs PCP, and the peripheral circuit lines PLP. The peripheral contact plugs PCP and the peripheral circuit lines PLP may be electrically connected to the peripheral circuits PTR.

The lower interlayer dielectric layer 50 may include a plurality of stacked dielectric layers. For example, the lower interlayer dielectric layer 50 may include one or more of a silicon oxide layer, a silicon nitride layer, a silicon oxynitride layer, and a low-k dielectric layer. For example, the lower interlayer dielectric layer 50 may include a first lower dielectric layer 51, a second lower dielectric layer 55, and an etch stop layer 53 between the first and second lower dielectric layers 51 and 55. The etch stop layer 53 may include a dielectric material different from that of the first and second lower dielectric layers 51 and 55, and may cover top surfaces of uppermost peripheral circuit lines PLP.

The cell array structure CS may be located on the lower interlayer dielectric layer 50. The cell array structure CS may include a semiconductor layer 100, a source structure CST, a stack structure ST, first and second vertical structures VS1 and VS2, cell contact plugs CPLG, through plugs TP, bit lines BIL, and conductive lines ICL. The memory cell strings (see CSTR of FIG. 1) may be integrated on the semiconductor layer 100. The stack structure ST and the first vertical structures VS1 may constitute the memory cell strings CSTR shown in FIG. 1.

The semiconductor layer 100 may be located on a top surface of the lower interlayer dielectric layer 50. The semiconductor layer 100 may be formed of a semiconductor material, a dielectric material, or a conductive material. The semiconductor layer 100 may include one or more of a semiconductor doped with impurities having a first conductivity type (e.g., n-type) and an intrinsic semiconductor doped with no impurities. The semiconductor layer 100 may have a crystal structure including at least one selected from a single-crystalline structure, an amorphous structure, and a polycrystalline structure.

The source structure CST may include a source semiconductor pattern SC and a support semiconductor pattern SP on the source semiconductor pattern SC. The source structure CST may be parallel to a top surface of the semiconductor layer 100, and on the cell array region CAR and a portion of the connection region CNR, may extend in the first direction D1 parallel to the stack structure ST.

On the cell array region CAR, the source semiconductor pattern SC may be located between the semiconductor layer 100 and the stack structure ST. The source semiconductor pattern SC may have openings OP on the cell array region CAR. The openings OP may be spaced apart from each other, and may each have a circular or bar shape. The source semiconductor pattern SC may be formed of a semiconductor material doped with impurities (e.g., phosphorus (P) or arsenic (As)) having the first conductivity type. For example, the source semiconductor pattern SC may be formed of a polysilicon layer doped with n-type impurities.

The support semiconductor pattern SP may cover a top surface of the source semiconductor pattern SC. The support semiconductor pattern SP may include one or more of a semiconductor doped with impurities having the first conductivity type (e.g., n-type) and an intrinsic semiconductor doped with no impurities. A concentration of n-type impurities may be less in the support semiconductor pattern SP than in the source semiconductor pattern SC.

On the cell array region CAR, portions of the support semiconductor pattern SP may penetrate the source semiconductor pattern SC to come into contact with the semiconductor layer 100. In the openings OP, the support semiconductor pattern SP may cover a sidewall of the source semiconductor pattern SC. The support semiconductor pattern SP may have a recessed top surface on the openings OP.

On the connection region CNR, a through dielectric pattern 111 may be provided to penetrate the source structure CST and the semiconductor layer 100. The through dielectric pattern 111 may contact the lower interlayer dielectric layer 50 and may have a top surface substantially coplanar with that of the source structure CST.

The stack structure ST may be located on the source structure CST. The stack structure ST may extend from the cell array region CAR toward the connection region CNR along the first direction D1, and may have a stepwise structure on the connection region CNR. The stepwise structure of the stack structure ST may have a height that decreases with increasing distance from the cell array region CAR.

The stack structure ST may include electrodes GE and dielectric layers ILD that are alternately stacked along a third direction D3 (or a vertical direction) perpendicular to the first direction D1 and a second direction D2 that intersects the first direction D1. The electrodes GE may include, e.g., at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum). The dielectric layers ILD may include one or more of a silicon oxide layer and a low-k dielectric layer. The semiconductor device may be a vertical NAND Flash memory device, and in this case, the electrodes GE of the stack structure ST may be used as the gate lower lines LL1 and LL2, the word lines WL, and the gate upper lines UL1 and UL2 that are discussed with reference to FIG. 1. A horizontal dielectric pattern HP (see FIG. 7) may conformally cover sidewalls, top surfaces, and bottom surfaces of the electrodes GE adjacent to the first and second vertical structures VS1 and VS2. The horizontal dielectric pattern HP may include one or more high-k dielectric layers such as an aluminum oxide layer or a hafnium oxide layer.

On the connection region CNR, the stack structure ST may include mold patterns MLP that are located at the same levels as those of the electrodes GE and are disposed between the dielectric layers ILD. The mold patterns MLP may include a dielectric material different from that of the dielectric layers ILD. The mold patterns MLP may include, e.g., at least one selected from silicon nitride, silicon oxynitride, and silicon-germanium. The mold patterns MLP may be closer than pad portions of the electrodes GE to the cell array region CAR. In addition, when viewed in plan, the mold patterns MLP may overlap the through dielectric pattern 111.

A planarized dielectric layer 120 may cover stepwise-shape pad portions of the stack structure ST. The planarized dielectric layer 120 may have a substantially flat top surface. The planarized dielectric layer 120 may include a single dielectric layer or a plurality of stacked dielectric layers. First, second, third, and fourth interlayer dielectric layers 130, 140, 150, and 160 may be sequentially stacked on the planarized dielectric layer 120.

The semiconductor layer 100 may be provided thereon with first, second, and third separation structures SS1, SS2, and SS3 that penetrate the stack structure ST. Each of the first, second, and third separation structures SS1, SS2, and SS3 may include a dielectric layer that covers a sidewall of the stack structure ST. Each of the first, second, and third separation structures SS1, SS2, and SS3 may have a single-layered structure or a multi-layered structure. The first, second, and third separation structures SS1, SS2, and SS3 may have their top surfaces located at substantially the same level.

The first separation structures SS1 may extend along the first direction D1 from the cell array region CAR toward the connection region CNR, and may be spaced apart from each other in the second direction D2 that intersects the first direction D1. On the cell array region CAR, the first separation structure SS1 may partially penetrate the support semiconductor pattern SP that fills the opening OP. On the cell array region CAR, the first separation structures SS1 may be in contact with the semiconductor layer 100.

On the cell array region CAR, the second separation structure SS2 may be located between the first separation structures SS1. When viewed in the first direction D1, the second separation structure SS2 may have a length less than that of the first separation structure SS1. In another implementation, a plurality of second separation structures SS2 may be provided between the first separation structures SS1.

On the connection region CNR, the third separation structures SS3 may be spaced apart from the first and second separation structures SS1 and SS2, while penetrating the planarized dielectric layer 120 and the stack structure ST. The third separation structures SS3 may extend along the first direction D1. The third separation structures SS3 may be spaced apart from each other in the first direction D1 and the second direction D2.

On the connection region CNR, the through structure SS4 may penetrate a portion of the stack structure ST. The through structure SS4 may be provided between the electrodes GE and the mold patterns MLP. When viewed in plan, the through structure SS4 may surround the mold patterns MLP. The through structure SS4 may include a dielectric layer that covers the sidewall of the stack structure ST and sidewalls of the mold patterns MLP. The through structure SS4 may be in contact with one of a top surface of the support semiconductor pattern SP and a top surface of the through dielectric pattern 111. The through structure SS4 may be positioned at substantially the same level as that of those of the first, second, and third separation structures SS1, SS2, and SS3.

On the cell array region CAR, a plurality of first vertical structures VS1 may penetrate the stack structure ST and the source structure CST. When viewed in plan, the first vertical structures VS1 may be arranged in a straight or zigzag fashion along one direction.

Referring to FIGS. 6A, 7, and 8, each of the first vertical structures VS1 may include a first vertical channel pattern VP1, a first data storage pattern DSP1, and a first gap-fill dielectric pattern VI1.

The first vertical channel pattern VP1 may include an upper portion UP that penetrates the stack structure ST, a lower portion LP that penetrates the source semiconductor pattern SC, a middle portion MP that penetrates the support semiconductor pattern SP, and a bottom portion BP in the semiconductor layer 100. The first vertical channel pattern VP1 may have a bottom surface at a lower level than that of a bottom surface of the source semiconductor pattern SC.

The upper portion UP of the first vertical channel pattern VP1 may have a first diameter R1. The lower portion LP of the first vertical channel pattern VP1 may have a second diameter R2 different from the first diameter R1. The middle portion MP of the first vertical channel pattern VP1 may have a third diameter R3 less than the first diameter R1 and the second diameter R2. The bottom portion BP of the first vertical channel pattern VP1 may have a fourth diameter less than the first diameter R1 and the second diameter R2.

The first vertical channel pattern VP1 may have a rounded sidewall profile at the middle portion MP. The first vertical channel pattern VP1 may have a minimum diameter at a level between those of top and bottom surfaces of the support semiconductor pattern SP. The minimum diameter of the first vertical channel pattern VP1 may be equal to or greater than about twice its thickness between the first gap-fill dielectric pattern VI1 and the sidewall of the stack structure ST.

The upper portion UP of the first vertical channel pattern VP1 may have a U-shape or a pipe shape with a closed bottom end. The first vertical channel pattern VP1 may have a substantially hourglass-type pillar shape at the middle portion MP. The first vertical channel pattern VP1 may have an air gap AG at the lower portion LP.

The first vertical channel structures VP1 may include a semiconductor material, such as silicon (Si), germanium (Ge), or a mixture thereof. The first vertical channel pattern VP1 including the semiconductor material may be used as channels of the upper transistors UT1 and UT2, of the memory cell transistors MCT, and of the lower transistors LT1 and LT2, all of which transistors are discussed with reference to FIG. 1.

The first gap-fill dielectric pattern VI1 may be located in the upper portion UP of the first vertical channel pattern VP1. The first gap-fill dielectric pattern VI1 may be vertically spaced apart from the top surface of the source semiconductor pattern SC. The bottom surface of the first gap-fill dielectric pattern VI1 may be spaced apart from the top surface of the support semiconductor pattern SP.

A barrier layer BO may be located between the first gap-fill dielectric pattern VI1 and the upper portion UP of the first vertical channel pattern VP1. The barrier layer BO may be formed of a silicon oxide layer, a silicon oxynitride layer, a silicon carbide layer, a silicon carbide nitride layer, or the like.

The lower portion LP of the first vertical channel pattern VP1 may be in contact with the source semiconductor pattern SC. The source semiconductor pattern SC may include a horizontal portion SCa (that is parallel to the stack structure ST between the support semiconductor pattern SP and the semiconductor layer 100) and a sidewall portion SCb (that contacts and surrounds a portion of the sidewall of the first vertical channel pattern VP1).

The horizontal portion SCa may have a top surface in contact with the bottom surface of the support semiconductor pattern SP, and a bottom surface in contact with the top surface of the semiconductor layer 100.

The sidewall portion SCb may vertically protrude from the horizontal portion SCa, and may intervene between the first vertical channel pattern VP1 and a sidewall of the support semiconductor pattern SP and between the first vertical channel pattern VP1 and the semiconductor layer 100. The sidewall portion SCb may be in partial contact with the sidewall of the support semiconductor pattern SP. The sidewall portion SCb may contact the first data storage pattern DSP1 and have a maximum width at its top surface in contact with the first data storage pattern DSP1. The first data storage pattern DSP1 may have a width that progressively decreases in a direction from upper to lower portions of the first data storage pattern DSP1.

The source semiconductor pattern SC may be vertically spaced apart from the first gap-fill dielectric pattern VI1 in the first vertical channel pattern VP1. Referring to FIG. 8, when the lower portion LP of the first vertical channel pattern VP1 is cut during fabrication, the source semiconductor pattern SC may fill the air gap AG defined at the lower portion LP of the first vertical channel pattern VP1. Even in this case, the source semiconductor pattern SC may be spaced apart from the first gap-fill dielectric pattern VI1.

The first data storage pattern DSP1 may extend in the third direction D3 and surround the sidewall of the first vertical channel pattern VP1. The first data storage pattern DSP1 may have a macaroni or pipe shape with opened top and bottom ends. The first data storage pattern DSP1 may have a bottom surface at a level between those of the top and bottom surfaces of the support semiconductor pattern SP.

The first data storage pattern DSP1 may include a first portion between the sidewall of the stack structure ST and the upper portion UP of the first vertical channel pattern VP1 and a second portion between the sidewall of the support semiconductor pattern SP and the middle portion MP of the first vertical channel pattern VP1. The second portion may have a thickness greater than that of the first portion. For example, the second portion may be thicker than the first portion and have a convex inner wall.

The first data storage pattern DSP1 may serve as a data storage layer of NAND Flash memory, and may include a tunnel dielectric layer TL, a charge storage layer CL, and a blocking dielectric layer BL that are sequentially stacked on the sidewall of the first vertical channel pattern VP1. The charge storage layer CL may be a trap dielectric layer, a floating gate electrode, or a dielectric layer including conductive nano-dots. The tunnel dielectric layer TL and the blocking dielectric layer BL may be one of materials whose bandgap is greater than that of the charge storage layer CL.

The blocking dielectric layer BL may include a first portion BLa between the first vertical channel pattern VP1 and the sidewall of the support semiconductor pattern SP and a second portion BLb between the first vertical channel pattern VP1 and the sidewall of the stack structure ST. The first portion BLa may have a first thickness T1, and the second portion BLb may have a second thickness T2 less than the first thickness T1. The first portion BLa may have a convex inner wall.

The tunnel dielectric layer TL and the charge storage layer CL may each have a thickness that is substantially uniform on the first and second parts BLa and BLb of the blocking dielectric layer BL.

The semiconductor layer 100 may be provided therein with a residual blocking pattern BLP, a residual charge pattern CLP, and a residual tunnel pattern TLP. The residual blocking pattern BLP, the residual charge pattern CLP, and the residual tunnel pattern TLP may surround the bottom portion BP of the first vertical channel pattern VP1.

Referring to FIGS. 5 and 6B, on the connection region CNR, the second vertical structures VS2 may penetrate the planarized dielectric layer 120, the stack structure ST, the support semiconductor pattern SP, and the source semiconductor pattern SC. The second vertical structures VS2 may penetrate the stepwise structure of the stack structure ST.

Lower and upper bit-line contact plugs BCTa and BCTb may not be connected to the second vertical structures VS2, and the second vertical structures VS2 may have their top surfaces that are completely covered with the first interlayer dielectric layer 130.

When viewed in plan, the second vertical structures VS2 may be located around their corresponding cell contact plugs CPLG. The second vertical structures VS2 may have their widths greater than those of the first vertical structures VS1. The second vertical structures VS2 may each have a bar shape or an oval shape having major and minor axes.

Referring to FIGS. 6B, 9, and 10, each of the second vertical structures VS2 may include a second vertical channel pattern VP2, a second data storage pattern DSP2, and a second gap-fill dielectric pattern VI2.

The second vertical channel pattern VP2 may have a U shape, and the second gap-fill dielectric pattern VI2 may fill an inside of the second vertical channel pattern VP2. The second vertical channel pattern VP2 may include the same semiconductor material as that of the first vertical channel pattern VP1.

Like the first vertical channel pattern VP1, the second vertical channel pattern VP2 may include an upper portion UP that penetrates the stack structure ST, a lower portion LP that penetrates the source semiconductor pattern SC, a middle portion MP that penetrates the support semiconductor pattern SP, and a bottom portion BP in the semiconductor layer 100.

The upper portion UP of the second vertical channel pattern VP2 may have a fifth diameter Ra greater than the first diameter R1 of the first vertical channel pattern VP1. The lower portion LP of the second vertical channel pattern VP2 may have a sixth diameter Rb greater than the second diameter R2 of the first vertical channel pattern VP1. The middle portion MP of the second vertical channel pattern VP2 may have a seventh diameter Rc greater than the third diameter R3 of the first vertical channel pattern VP1. The seventh diameter Rc may be less than the fifth diameter Ra and the sixth diameter Rb. The second vertical channel pattern VP2 may have a rounded sidewall profile at the middle portion MP and a minimum diameter at the middle portion MP.

The second vertical channel pattern VP2 may have a minimum diameter equal to or greater than about twice its thickness between the second gap-fill dielectric pattern VI2 and the sidewall of the stack structure ST.

Referring to FIG. 9, the second vertical channel pattern VP2 may have a thickness that is substantially uniform over the upper portion UP, the middle portion MP, the lower portion LP, and the bottom portion BP. Thus, the second gap-fill dielectric pattern VI2 that fills the second vertical channel pattern VP2 may have a bottom surface at a lower level than that of the bottom surface of the source semiconductor pattern SC.

Referring to FIG. 10, the upper portion UP of the second vertical channel pattern VP2 may have a pipe shape with a closed bottom end, and the middle portion MP of the second vertical channel pattern VP2 may have a pillar shape with a sandglass-shape sidewall. The second vertical channel pattern VP2 may have an air gap AG at the lower portion LP. The second gap-fill dielectric pattern VI2 may be located in the upper portion UP of the second vertical channel pattern VP2 and may be vertically spaced apart from the top surface of the source semiconductor pattern SC.

The second data storage pattern DSP2 may be formed of the same material as that of the first data storage pattern DSP1. For example, the second data storage pattern DSP2 may include a tunnel dielectric layer TL, a charge storage layer CL, and a blocking dielectric layer BL that are sequentially stacked.

Like the first data storage pattern DSP1, the second data storage pattern DSP2 may include a first portion between the sidewall of the stack structure ST and the upper portion UP of the second vertical channel pattern VP2 and a second portion between the sidewall of the support semiconductor pattern SP and the middle portion MP of the second vertical channel pattern VP2. The second portion may have a thickness greater than that of the first portion. For example, the second portion may be thicker than the first portion and have a convex inner wall.

The blocking dielectric layer BL may include a first portion BLa between the second vertical channel pattern VP2 and the sidewall of the support semiconductor pattern SP and a second portion BLb between the second vertical channel pattern VP2 and the sidewall of the stack structure ST. The first portion BLa may have a first thickness, and the second portion BLb may have a second thickness less than the first thickness. The first portion BLa may have a convex inner wall.

Referring back to FIGS. 5, 6A, and 6B, the cell contact plugs CPLG may penetrate the first and second interlayer dielectric layers 130 and 140 and the planarized dielectric layer 120, and may be correspondingly coupled to the pad portions of the electrodes GE. The cell contact plugs CPLG may have their vertical lengths that decrease with decreasing distance from the cell array region CAR. The cell contact plugs CPLG may have their top surfaces substantially coplanar with each other. The conductive lines ICL may be located on the fourth interlayer dielectric layer 160 of the connection region CNR, and may be coupled to the cell contact plugs CPLG through lower and upper contact plugs (not shown).

Although no bit lines are illustrated in plan views, referring to FIGS. 6A and 6B, on the cell array region CAR, the bit lines BIL may be located on the fourth interlayer dielectric layer 160, and may extend in the second direction D2 while running across the stack structure ST. The bit lines BIL may be electrically connected to the first vertical structures VS1 through the lower and upper bit-line contact plugs BCTa and BCTb.

On the connection region CNR, the through plugs TP may vertically penetrate the through dielectric pattern 111 and the mold patterns MLP, thereby being connected to the peripheral circuit lines PLP. The through plugs TP may be electrically connected through the conductive lines ICL to the cell contact plugs CPLG.

The cell contact plugs CPLG and the through plugs TP may each include a barrier metal layer including conductive metal nitride (e.g., titanium nitride or tantalum nitride) and a metal layer including metal (e.g., tungsten, titanium, or tantalum).

Figure 11:
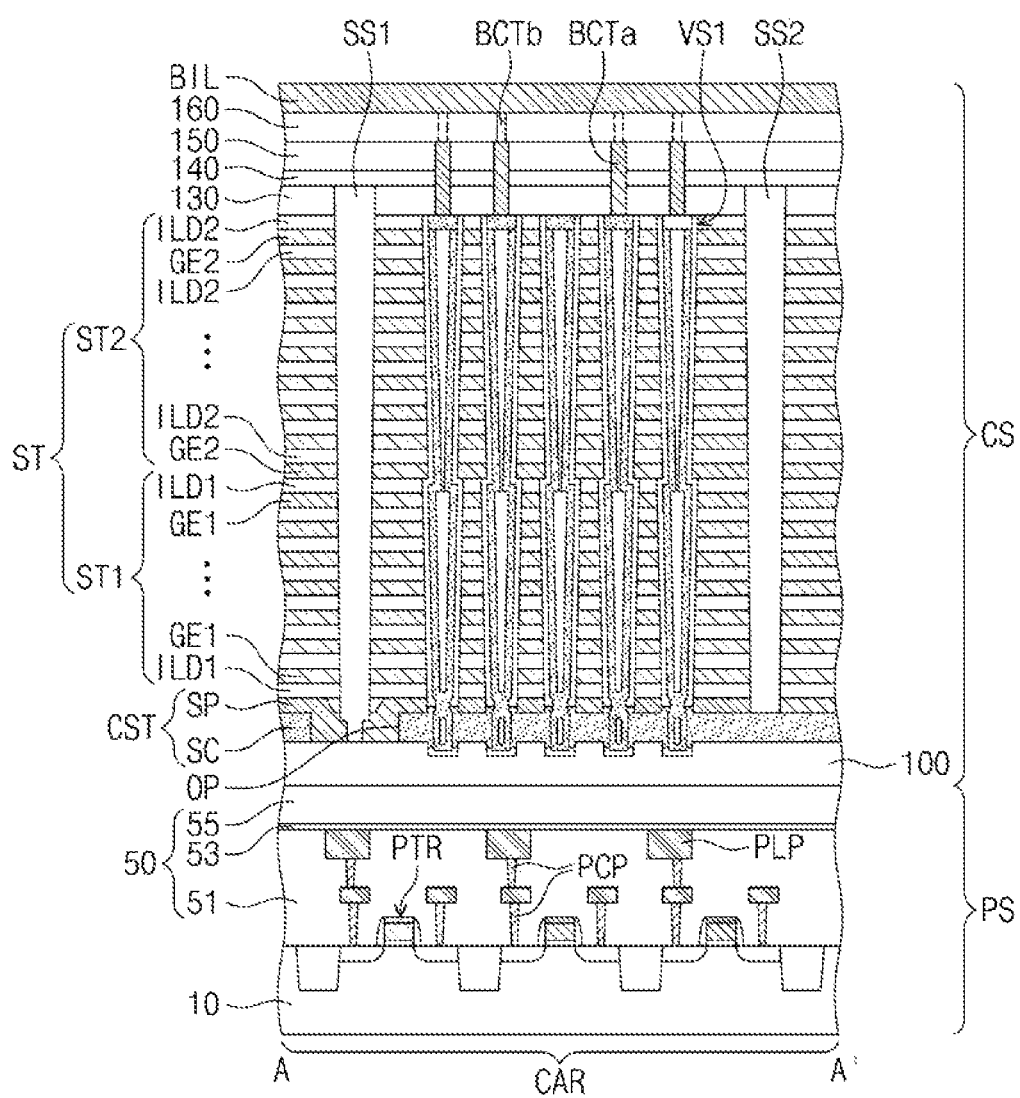
FIG. 11 illustrates a cross-sectional view taken along line A-A' of FIG. 5, showing a semiconductor device according to an example embodiment.

FIG. 11 illustrates a cross-sectional view taken along line A-A' of FIG. 5, showing a semiconductor device according to an example embodiment. In the description that follows, a detailed description of elements repetitive to those discussed above with reference to FIGS. 5 to 10 will be omitted, and a difference thereof will be explained in detail.

Referring to FIGS. 5 and 11, the stack structure ST on the semiconductor layer 100 may include a first stack structure ST1 and a second stack structure ST2 on the first stack structure ST1. The first stack structure ST1 may include first electrodes GE1 that are stacked in a direction (e.g., the third direction D3) perpendicular to the semiconductor layer 100. The first stack structure ST1 may further include first dielectric layers ILD1 that separate the stacked first electrodes GE1 from each other. The first dielectric layers ILD1 and the first electrodes GE1 of the first stack structure ST1 may be stacked alternately with each other in the third direction D3. A second dielectric layer ILD2 may be provided on an uppermost portion of the first stack structure ST1.

The second stack structure ST2 may include second electrodes GE2 that are stacked in the third direction D3 on the first stack structure ST1. The second stack structure ST2 may further include second dielectric layers ILD2 that separate the stacked second electrodes GE2 from each other. The second dielectric layers ILD2 and the second electrodes GE2 of the second stack structure ST2 may be stacked alternately with each other in the third direction D3.

Each of the first vertical structures VS1 may include a first vertical extension that penetrates the first stack structure ST1, a second vertical extension that penetrates the second stack structure ST2, and an expansion between the first and second vertical extensions. The expansion may be provided in an uppermost first dielectric layer ILD1. The first vertical structure VS1 may have a diameter that abruptly increases at the expansion. The second vertical structures (see VS2 of FIG. 6B) on the connection region (see CNR of FIG. 6B) may have the same shape as that of the first vertical structure VS1.

FIGS. 12A to 16A illustrate cross-sectional views taken along line A-A' of FIG. 5 and FIGS. 12B to 16B illustrate cross-sectional views taken along line B-B' of FIG. 5 showing a method of fabricating a three-dimensional semiconductor memory device according to an example embodiment.

Figure 12A:
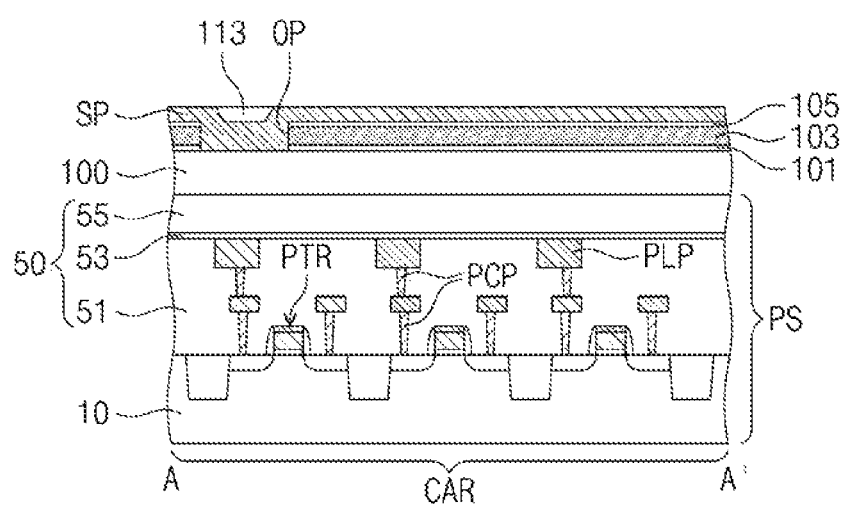
Figure 12B:
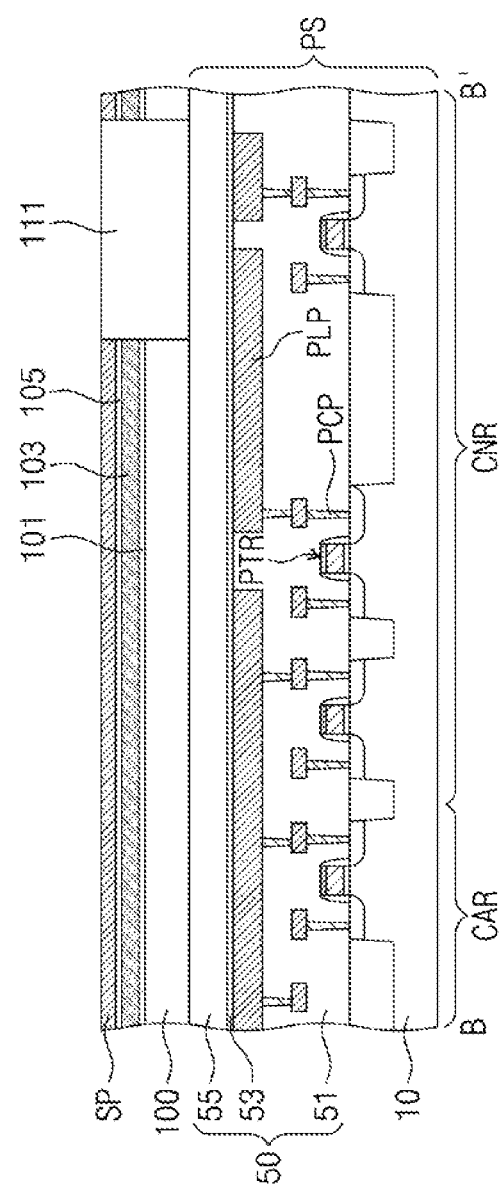

Referring to FIGS. 12A and 12B, a peripheral circuit structure PS may be formed on a semiconductor substrate 10 that has a cell array region CAR and a connection region CNR. The formation of the peripheral circuit structure PS may include forming peripheral circuits PTR on the semiconductor substrate 10, forming peripheral wiring structures PCP and PLP that are connected to the peripheral circuits PTR, and forming a lower interlayer dielectric layer 50. The peripheral circuits PTR may include metal oxide semiconductor (MOS) transistors each of which uses the semiconductor substrate 10 as a channel.

The lower interlayer dielectric layer 50 may include a single dielectric layer that covers the peripheral circuits PTR or a plurality of stacked dielectric layers that cover the peripheral circuits PTR. The lower interlayer dielectric layer 50 may include a first lower dielectric layer 51, a second lower dielectric layer 55, and an etch stop layer 53 between the first and second lower dielectric layers 51 and 55. The lower interlayer dielectric layer 50 may include, e.g., one or more of a silicon oxide layer, a silicon nitride layer, a silicon oxynitride layer, and a low-k dielectric layer.

The formation of the peripheral wiring structures PCP and PLP may include forming peripheral contact plugs PCP that partially penetrate the lower interlayer dielectric layer 50 and forming peripheral circuit lines PLP connected to the peripheral contact plugs PCP.

A semiconductor layer 100 may be formed by disposing a semiconductor material on the lower interlayer dielectric layer 50. The semiconductor layer 100 may be formed of a semiconductor material, and the semiconductor material may include, e.g., silicon (Si), germanium (Ge), silicon germanium (SiGe), gallium arsenic (GaAs), indium gallium arsenic (InGaAs), aluminum gallium arsenic (AlGaAs), or a mixture thereof. Additionally or alternatively, the semiconductor layer 100 may include one or more of an impurity-doped semiconductor and an impurity-undoped intrinsic semiconductor. The semiconductor layer 100 may have a crystal structure including at least one selected from a single-crystalline structure, an amorphous structure, and a polycrystalline structure.

A first dielectric layer 101, a second dielectric layer 103, and a third dielectric layer 105 may be sequentially stacked on the semiconductor layer 100. The first dielectric layer 101 may be formed by thermally oxidizing a surface of the semiconductor layer 100 or by depositing a silicon oxide layer. The second dielectric layer 103 may be formed of a material having an etch selectivity with respect to the first dielectric layer 101 and the third dielectric layer 105. For example, the second dielectric layer 103 may be at least one selected from a silicon nitride layer, a silicon oxynitride layer, and a silicon carbide layer, and a silicon-germanium layer. The third dielectric layer 105 may be formed by depositing a silicon oxide layer.

Referring to FIGS. 5, 12A, and 12B, the first dielectric layer 101, the second dielectric layer 103, and the third dielectric layer 105 may have openings OP formed therein that partially expose the semiconductor layer 100 on the cell array region CAR and the connection region CNR. The formation of the openings OP may include forming a mask pattern (not shown) that partially expose the connection region CNR and the cell array region CAR, and then using the mask pattern as an etching mask to etch the first, second, and third dielectric layers 101, 103, and 105 to expose the first dielectric layer 101 or the semiconductor layer 100. After the openings OP are formed, the mask pattern may be removed.

After the formation of the openings OP, a support semiconductor pattern SP may be formed to have a uniform thickness on the third dielectric layer 105. On the cell array region CAR, the support semiconductor pattern SP may fill the openings OP of the first, second, and third dielectric layers 101, 103, and 105. In the openings OP, the support semiconductor pattern SP may be in direct contact with the semiconductor layer 100. The support semiconductor pattern SP may be a polysilicon layer doped with n-type impurities and/or carbon (C).

Afterwards, the support semiconductor pattern SP, the third dielectric layer 105, the second dielectric layer 103, the first dielectric layer 101, and the semiconductor layer 100 may be patterned to form openings that partially expose the lower interlayer dielectric layer 50 on the connection region CNR. Then, a through dielectric pattern 111 may be formed to fill the openings.

The through dielectric pattern 111 may be formed by filling the openings with a dielectric material, and then performing a planarization process to expose a top surface of the support semiconductor pattern SP. When the through dielectric pattern 111 is formed, a portion 113 of the dielectric material may remain on the support semiconductor pattern SP in the openings OP.

Figure 13A:
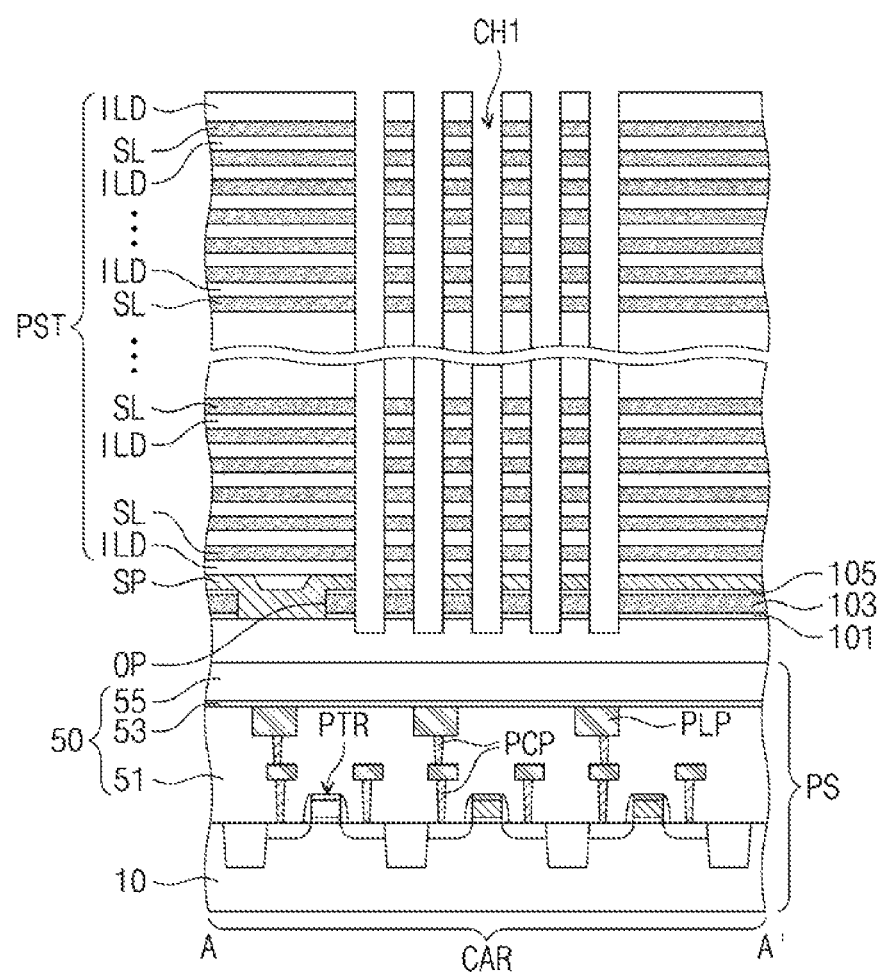
Figure 13B:
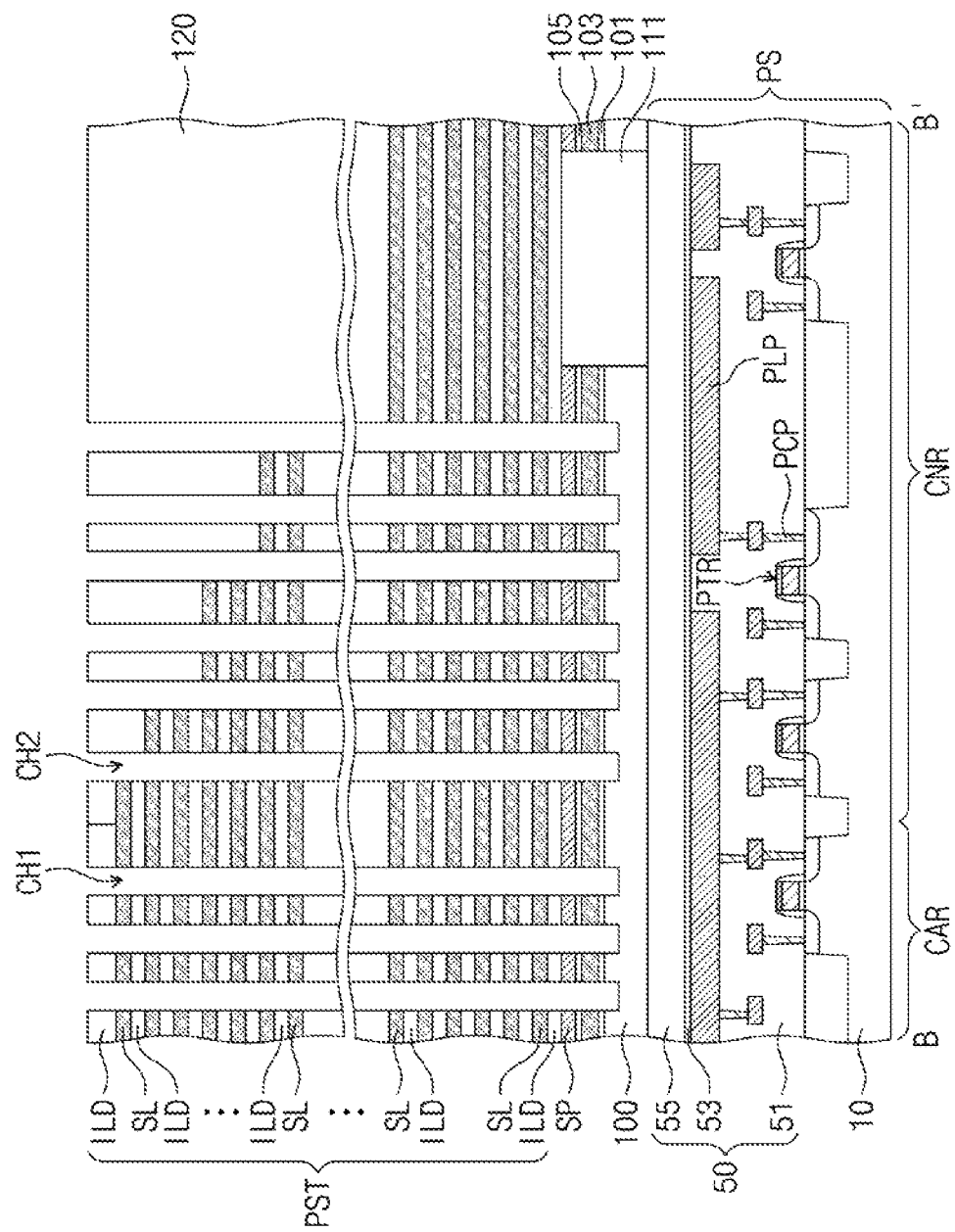

Referring to FIGS. 13A and 13B, a mold structure PST may be formed to include dielectric layers ILD and sacrificial layers SL that are vertically and alternately stacked on the support semiconductor pattern SP. The mold structure PST may have a stepwise structure on the connection region CNR.

When the mold structure PST is formed, the sacrificial layers SL may be formed of a material having an etch selectivity with respect to the dielectric layers ILD. For example, the sacrificial layers SL may include a dielectric material different from that of the dielectric layers ILD. The sacrificial layers SL may be formed of the same material as that of the second dielectric layer 103. For example, the sacrificial layers SL may be formed of a silicon nitride layer, and the dielectric layers ILD may be formed of a silicon oxide layer.

After the formation of the mold structure PST, a planarized dielectric layer 120 may be formed to cover the stepwise structure of the mold structure PST.

Thereafter, first channel holes CH1 may be formed to penetrate the mold structure PST on the cell array region CAR, and second channel holes CH2 may be formed to penetrate the mold structure PST on the connection region CNR. The second channel holes CH2 may have a width greater than that of the first channel holes CH1.

The formation of the first and second channel holes CH1 and CH2 may include forming on the mold structure PST a mask pattern (not shown) having openings that define areas where the first and second channel holes CH1 and CH2 are intended to be formed, and using the mask pattern as an etching mask to perform an anisotropic etching process on the mold structure PST, the support semiconductor pattern SP, and the first, second, and third dielectric layers 101, 103, and 105. The anisotropic etching process may include a plasma etching process, a reactive ion etching (RIE) process, a high-frequency inductively coupled plasma reactive ion etching (ICP-RIE) process, or an ion beam etching (IBE) process.

When the anisotropic etching process is performed to form the first and second channel holes CH1 and CH2, the semiconductor layer 100 may be over-etched on its top surface, and thus the top surface of the semiconductor layer 100 exposed to the first and second channel holes CH1 and CH2 may be recessed to a predetermined depth. For example, the first and second channel holes CH1 and CH2 may have their bottom surfaces at a lower level than that of the top surface of the semiconductor layer 100.

When viewed in plan, the first and second channel holes CH1 and CH2 may be arranged in a straight or zigzag fashion along one direction. A detailed description of planar arrangement of the first and second channel holes CH1 and CH2 may be the same as that of planar arrangement of the first and second vertical structures VS1 and VS2 discussed above with reference to FIG. 5.

Figure 14A:
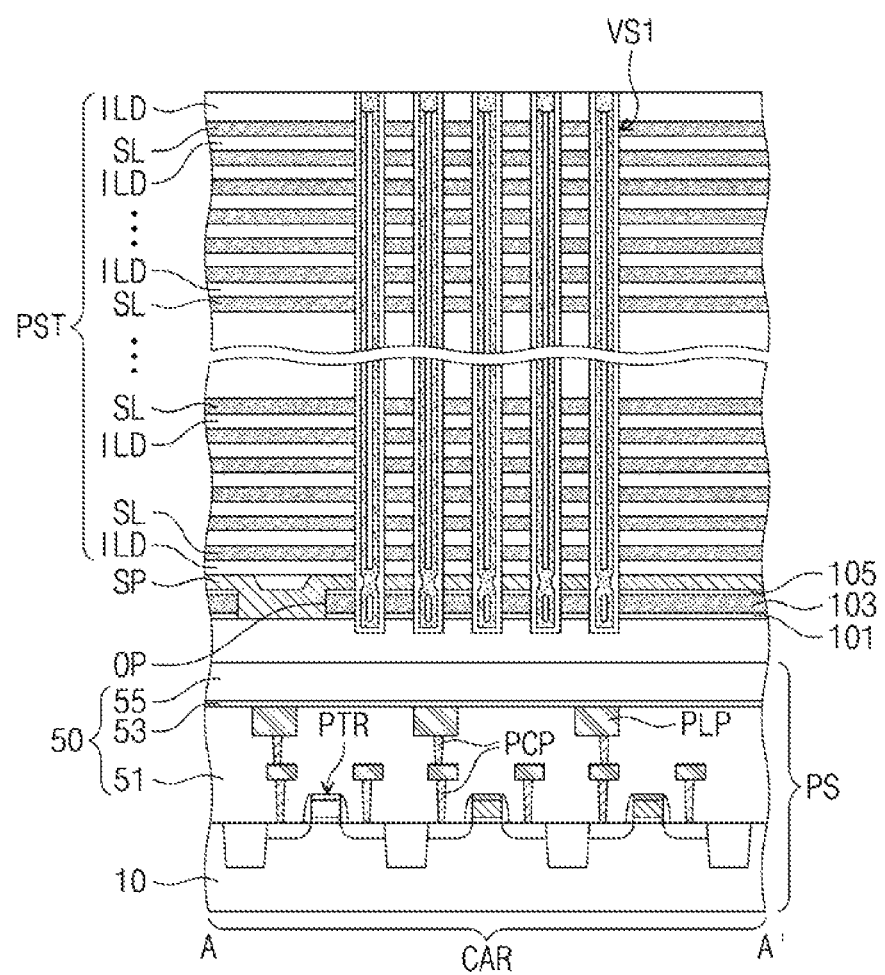
Figure 14B:
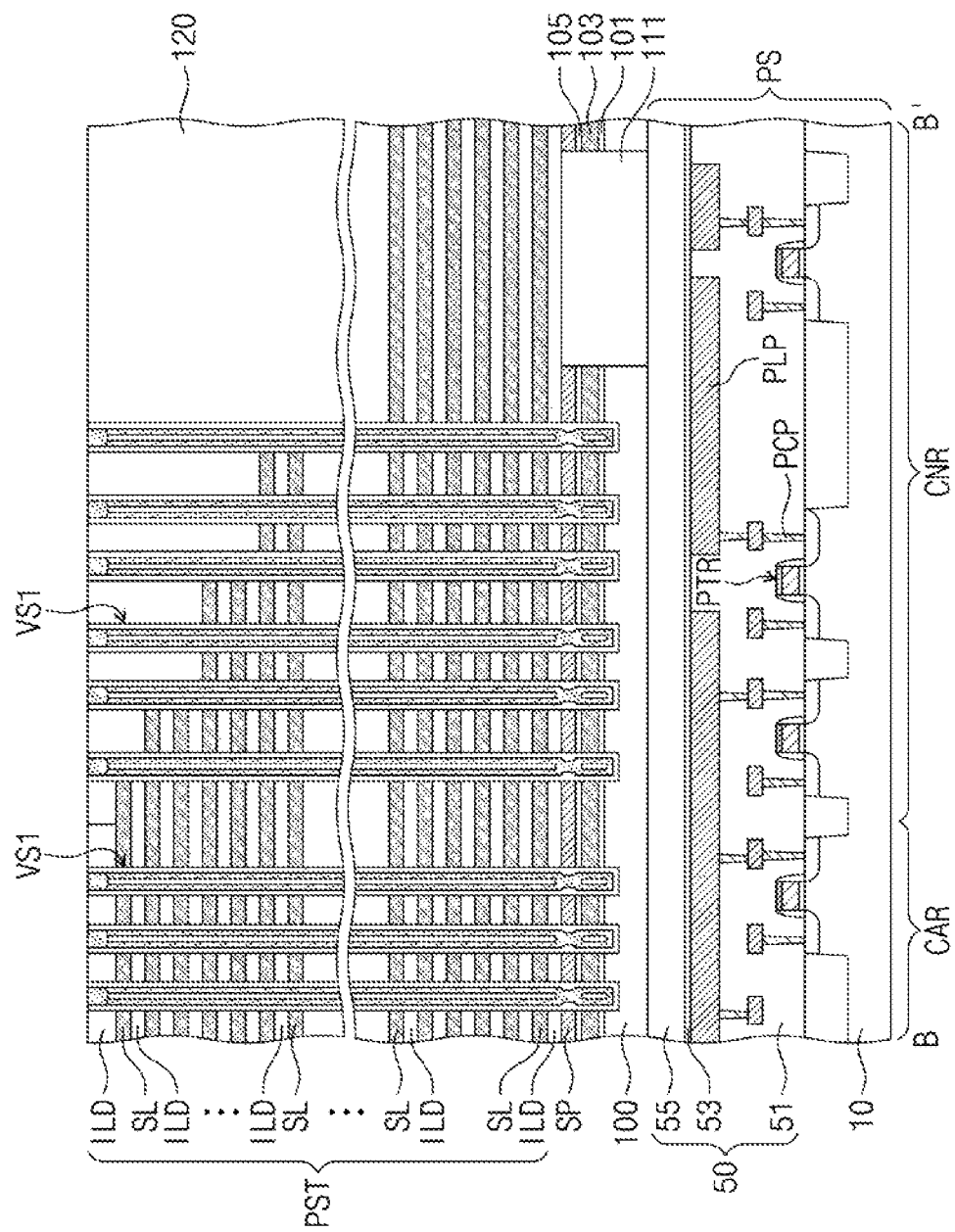

Referring to FIGS. 14A and 14B, first vertical structures VS1 may be formed in the first channel holes CH1, and second vertical structures VS2 may be formed in the second channel holes CH2. The formation of the first and second vertical structures VS1 and VS2 may include sequentially forming a data storage layer and a vertical channel layer in the first and second channel holes CH1 and CH2. The data storage layer may include a tunnel dielectric layer, a charge storage layer, and a blocking dielectric layer that are sequentially stacked.

Bit-line conductive pads may be formed on top ends of the vertical semiconductor layers included in the first and second vertical structures VS1 and VS2. The bit-line conductive pads may be impurity-doped regions or may be formed of a conductive material.

With reference to FIGS. 17 to 22, the following will describe in detail the formation of the first and second vertical structures VS1 and VS2 according to an example embodiment.

Figure 15A:
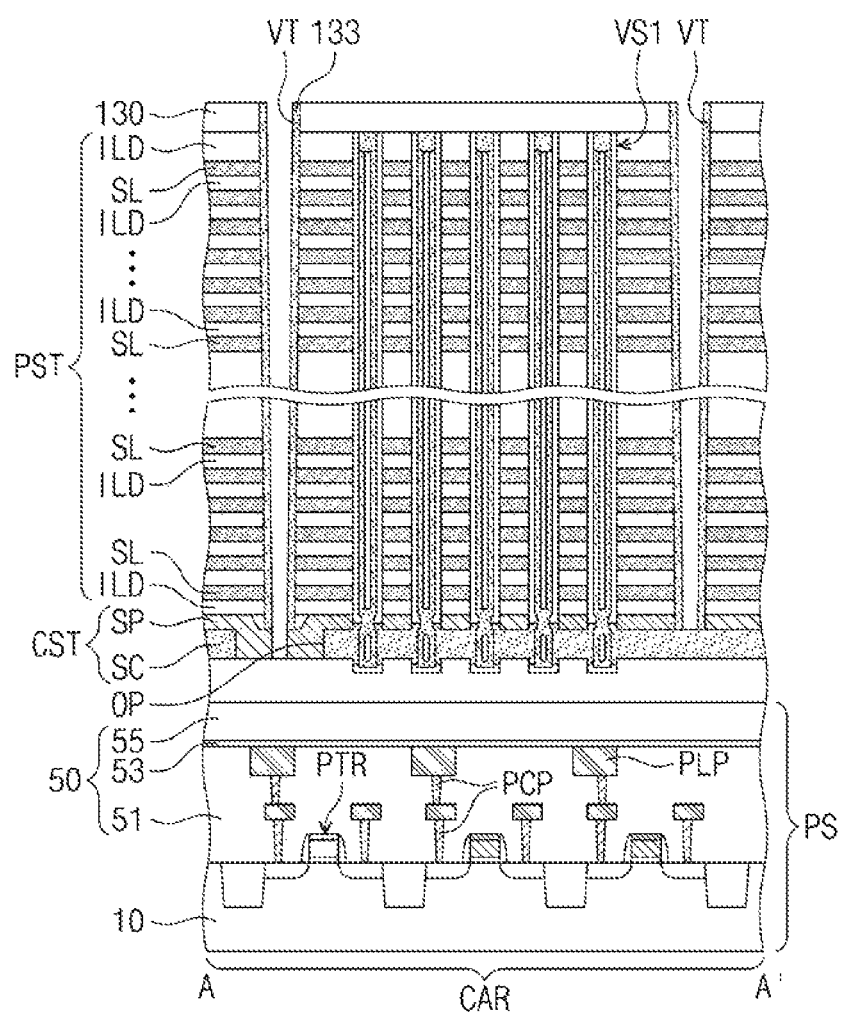
Figure 15B:
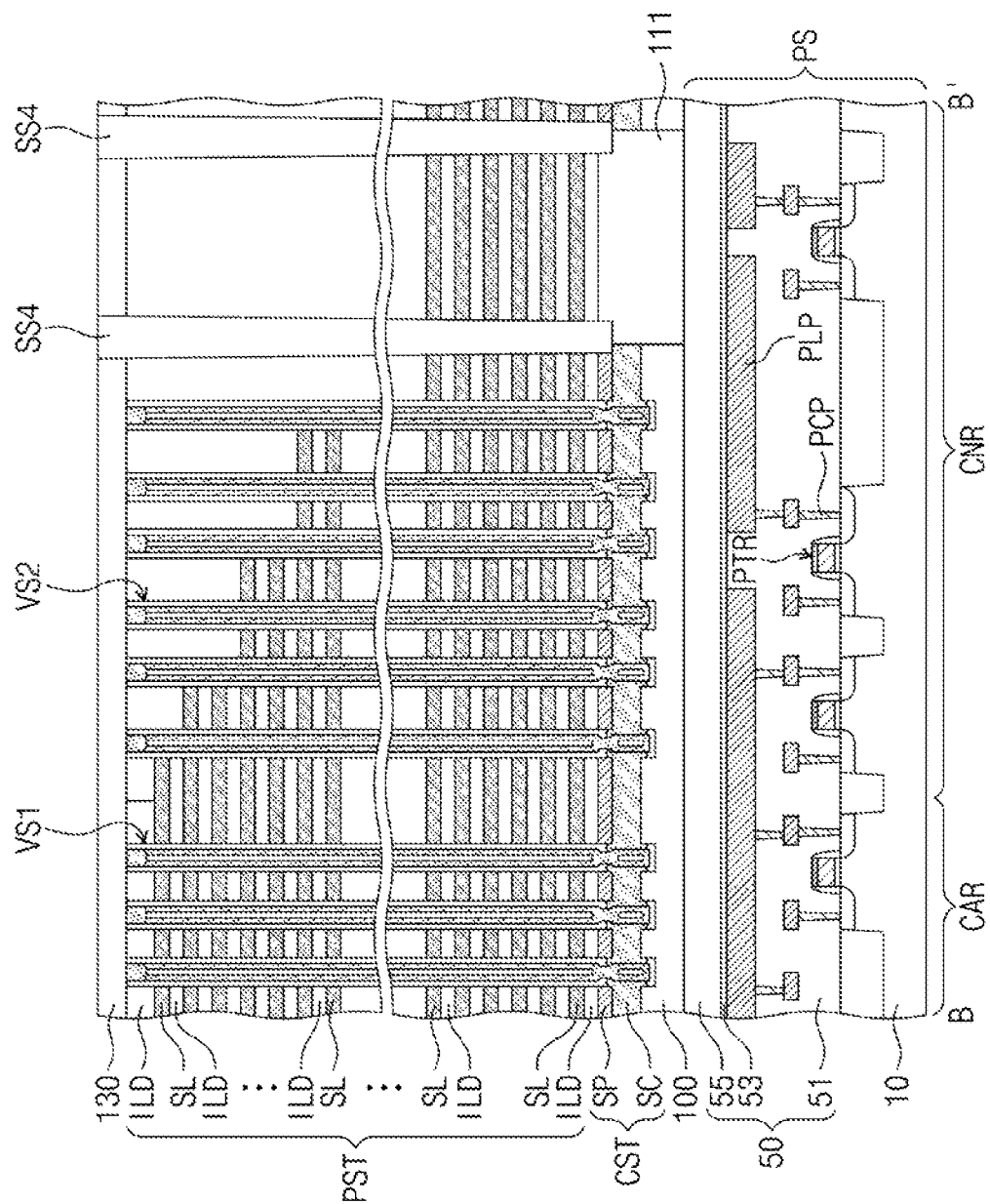

Referring to FIGS. 5, 15A, and 15B, after the first and second vertical structures VS1 and VS2 are formed, a first interlayer dielectric layer 130 may be formed on the planarized dielectric layer 120, covering top surfaces of the first and second vertical structures VS1 and VS2.

Afterwards, separation trenches VT may be formed to penetrate the mold structure PST and to expose the support semiconductor pattern SP. The separation trenches VT may be formed by an anisotropic etching process performed on the planarized dielectric layer 120 and the mold structure PST, and the support semiconductor pattern SP may be used as an etch stop layer when the anisotropic etching process is executed.

The separation trenches VT may extend in a first direction D1 and may be spaced apart from each other in a second direction D2. The separation trenches VT may extend from the cell array region CAR toward the connection region CNR. The separation trenches VT may have different lengths from each other in the first direction D1.

A portion of the separation trenches VT may penetrate the mold structure PST on the connection region CNR, and when viewed in plan, the portion of the separation trenches VT may have a ring shape that surrounds the through dielectric pattern 111.

After that, a sacrificial spacer 133 may be formed to cover a sidewall of the mold structure PST in the separation trenches VT.

The formation of the sacrificial spacer 133 may include forming a sacrificial spacer layer that conformally covers an inner wall of the separation trench VT, and allowing the sacrificial spacer layer to undergo an anisotropic etching process to form a through hole. The through hole may be formed by etching he support semiconductor pattern SP and the third dielectric layer 105 that are provided below the separation trench VT when the anisotropic etching process is performed on the sacrificial spacer layer. For example, after the sacrificial spacer 133 is formed, the second dielectric layer 103 may be exposed to the separation trenches VT.

The sacrificial spacer 133 may be formed of a material (e.g., polysilicon) having an etch selectivity with respect to the mold structure PST. A chemical vapor deposition (CVD) or atomic layer deposition (ALD) process may be used to deposit the sacrificial spacer 133 having a uniform thickness on the inner wall of the separation trench VT. The sacrificial spacer 133 may be deposited to have a thickness less than about half a width of the separation trench VT. Thus, the sacrificial spacer 133 may define an air gap in the separation trench VT.

In an example, before the sacrificial spacer 133 is formed, a through structure SS4 formed of a dielectric material may be formed in the separation trench VT having a ring shape.

In another example, the sacrificial spacer 133 may also be formed in the ring-shape separation trench VT.

Referring still to FIGS. 15A and 15B, after the sacrificial spacer 133 is formed, on the cell array region CAR, the first dielectric layer 101, the second dielectric layer 103, and the third dielectric layer 105 may be replaced with a source semiconductor pattern SC.

The formation of the source semiconductor pattern SC may include performing an isotropic etching process on the first, second, and third dielectric layers 101, 103, and 105 exposed to the through holes and portions of the data storage layer. During the isotropic etching process on the first, second, and third dielectric layers 101, 103, and 105, portions of the support semiconductor pattern SP that fill the openings OP may serve as a support that prevents collapse of the mold structure PST.

As the portions of the data storage layer are isotropically etched, sidewalls of the vertical channel layers included in the first and second vertical structures VS1 and VS2 may be partially exposed. The isotropic etching process on the data storage layer may form a data storage pattern and a residual data storage pattern that are vertically spaced apart from each other.

After the partial exposure of the vertical channel layers included in the first and second vertical structures VS1 and VS2, an impurity-doped polysilicon layer may be deposited to form the source semiconductor pattern SC. Thus, a source structure CST may be formed between the semiconductor layer 100 and the mold structure PST.

Figure 16A:
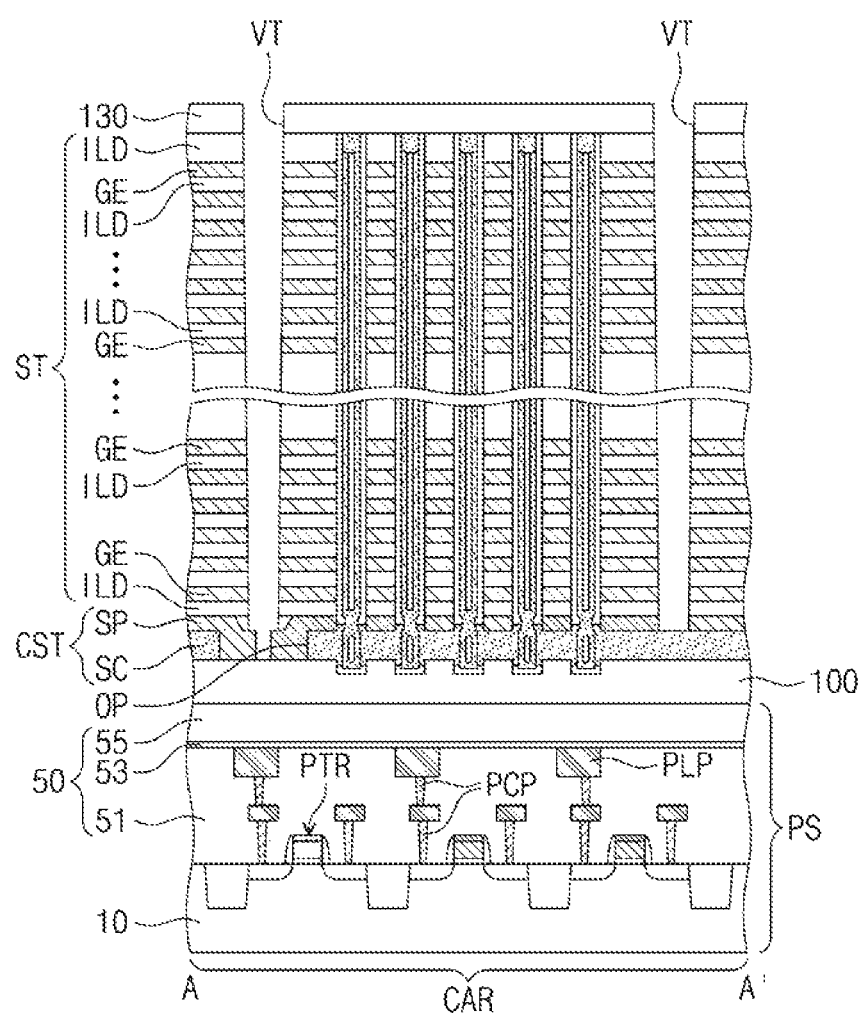

Referring to FIGS. 16A and 16B, after the source structure CST is formed, an isotropic etching process may be performed to remove the sacrificial spacer 133. The isotropic etching process on the sacrificial spacer 133 may include a wet etching process that use Standard Clean 1 (SC1) or aqueous ammonia ($NH_4OH$). Thus, the separation trenches VT may re-expose sidewalls of the sacrificial layers SL of the mold structure PST. On the connection region CNR, the separation trenches VT may expose the top surface of the source semiconductor pattern SC.

Thereafter, the sacrificial layers SL may be replaced with electrodes GE, and thus a stack structure ST may be formed as discussed above. The formation of the stack structure ST may include allowing the sacrificial layers SL to undergo an isotropic etching process that uses an etch recipe having an etch selectivity with respect to the dielectric layers ILD, the first and second vertical structures VS1 and VS2, and the source structure CST. When the isotropic etching process is performed on the sacrificial layers SL, on the connection region CNR, portions of the sacrificial layers SL may remain to form mold patterns MLP.

After the stack structure ST is formed, the separation trenches VT may be filled with a dielectric material to form separation structures SS1 and SS2. The separation structures SS1 and SS2 may each have a single-layered or multi-layered structure. The separation structures SS1 and SS2 may include at least one selected from silicon oxide, silicon nitride, and polysilicon.

After that, referring to FIGS. 6A and 6B, a second interlayer dielectric layer 140 may be formed on the first interlayer dielectric layer 130, and cell contact plugs CPLG may be formed to have connection with the electrodes GE of the stack structure ST. In addition, through plugs TP may be formed to have connection with the peripheral circuit lines PLP.

Third and fourth interlayer dielectric layers 150 and 160 may be formed on the second interlayer dielectric layer 140. Lower and upper contact plugs (not shown) and connection conductive patterns (not shown) may be formed in the third and fourth interlayer dielectric layers 150 and 160 on the connection region CNR. Bit lines BIL and conductive lines ICL may be formed on the fourth interlayer dielectric layer 160.

FIGS. 17 to 22 illustrate cross-sectional views of section P1 of FIG. 6A, showing a method of forming a vertical structure and a source structure of a three-dimensional semiconductor memory device according to an example embodiment.

Figure 17:
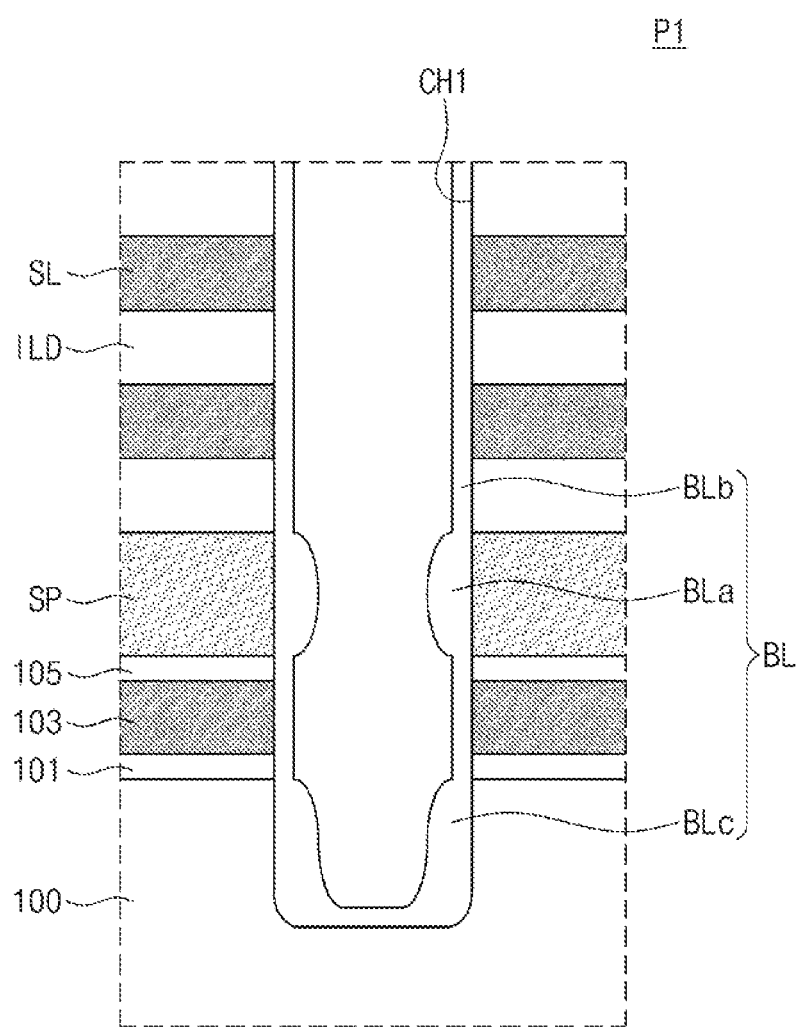
FIGS. 17 to 22 illustrate cross-sectional views of section P1 of FIG. 6A, showing a method of forming a vertical structure and a source structure of a three-dimensional semiconductor memory device according to an example embodiment.

Referring to FIG. 17, after the first and second channel holes CH1 and CH2 are formed to penetrate the mold structure PST as discussed with reference to FIGS. 13A and 13B, a blocking dielectric layer BL may be formed in each of the first and second channel holes CH1 and CH2. The following description will focus on a series of processes performed on the first channel hole CH1 (referred to in brief hereinafter as the channel hole).

The blocking dielectric layer BL may be deposited using, e.g., a thermal chemical vapor deposition (CVD) process, a plasma enhanced CVD process, a physical vapor deposition (PVD) process, or an atomic layer deposition (ALD) process.

The blocking dielectric layer BL may be formed by, e.g., depositing a polysilicon layer on an inner wall of the channel hole CH1, and then oxidizing the polysilicon. A gaseous compound containing silicon and chlorine may be used as a source gas in a process where a polysilicon layer is deposited for forming the blocking dielectric layer BL. For example, the source gas may include at least one selected from dichlorosilane (DCS, $SiH_2Cl_2$), monochlorosilane ($SiH_3Cl$), trichlorosilane ($SiHCl_3$), hexachlorodisilane ($Si_2Cl_6$), or may include, e.g., di-isopropyl-amino-silane (DIPAS), and bis(diisopropylamino)disilane (BDIPADS). The blocking dielectric layer BL may be formed by, e.g., chemical vapor deposition (CVD) or atomic layer deposition (ALD).

Before the blocking dielectric layer BL is formed, the inner wall of the channel hole CH1 may undergo a pretreatment process that uses either a precursor whose electronegativity difference is large (e.g., DIPAS or BDIPADS) or ozone ($O_3$) and deionized water (DI). Such pretreatment process may cause silicon elements to have their adsorption forces changed based on materials exposed to the inner wall of the channel hole CH1.

When the polysilicon layer is deposited for forming the blocking dielectric layer BL, the polysilicon layer may be deposited at a higher rate on the support semiconductor pattern SP formed of polysilicon than on the dielectric layers ILD and the sacrificial layers SL. In an example, a source gas including a single silicon atom (e.g., DCS) may be used when the polysilicon layer is deposited. Thus, the polysilicon layer may have a thickness that is greater on a sidewall of the support semiconductor pattern SP than on sidewalls of the dielectric layers ILD and the sacrificial layers SL. In addition, the thickness of the polysilicon layer may be greater on a surface of the semiconductor layer 100 exposed to the channel hole CH1 than on the sidewalls of the dielectric layers ILD and the sacrificial layers SL.

After the polysilicon layer is deposited, a plasma oxidation process may be performed on the polysilicon layer, and thus the blocking dielectric layer BL may be formed in the channel hole CH1. The blocking dielectric layer BL may include a first portion BLa on the support semiconductor pattern SP, a second portion BLb on the dielectric layers ILD and the sacrificial layers SL, and a third portion BLc on the semiconductor layer 100, and each of the first and third parts BLa and BLc may have a thickness greater than that of the second portion BLb. Thus, the channel hole CH1 in which the blocking dielectric layer BL is formed may have a small diameter at its portion around the support semiconductor pattern SP, e.g., corresponding to a vertical level of the support semiconductor pattern SP.

Figure 18:
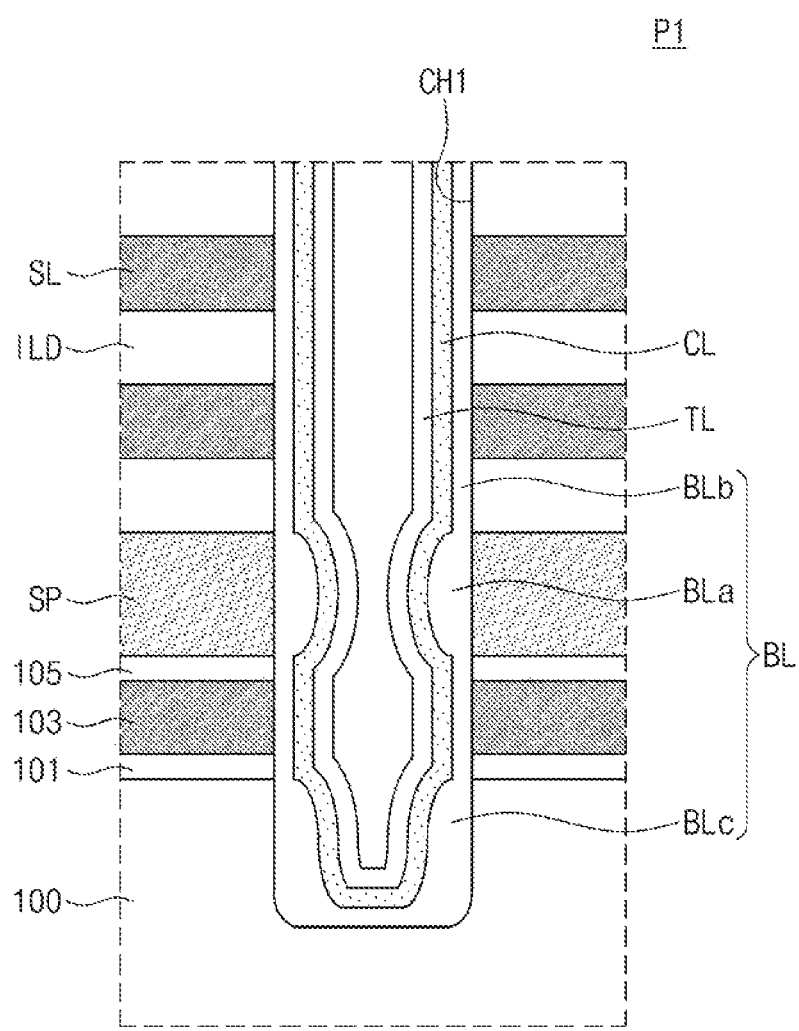

Referring to FIG. 18, a charge storage layer CL and a tunnel dielectric layer TL may be sequentially deposited on the blocking dielectric layer BL.

The charge storage layer CL and the tunnel dielectric layer TL may each be formed to have a substantially uniform thickness. The charge storage layer CL and the tunnel dielectric layer TL may be conformally deposited along a profile of the blocking dielectric layer BL. Thus, each of the charge storage layer CL and the tunnel dielectric layer TL may have a rounded profile at their respective portions located adjacent to, e.g., at the level of, the support semiconductor pattern SP.

The blocking dielectric layer BL, the charge storage layer CL, and the tunnel dielectric layer TL may constitute a data storage layer having a maximum thickness in a lateral direction that is less than the radius of the channel hole CH1 and, thus, once the tunnel dielectric layer TL is formed, the channel hole CH1 may define an empty space without being completely filled.

Figure 19:
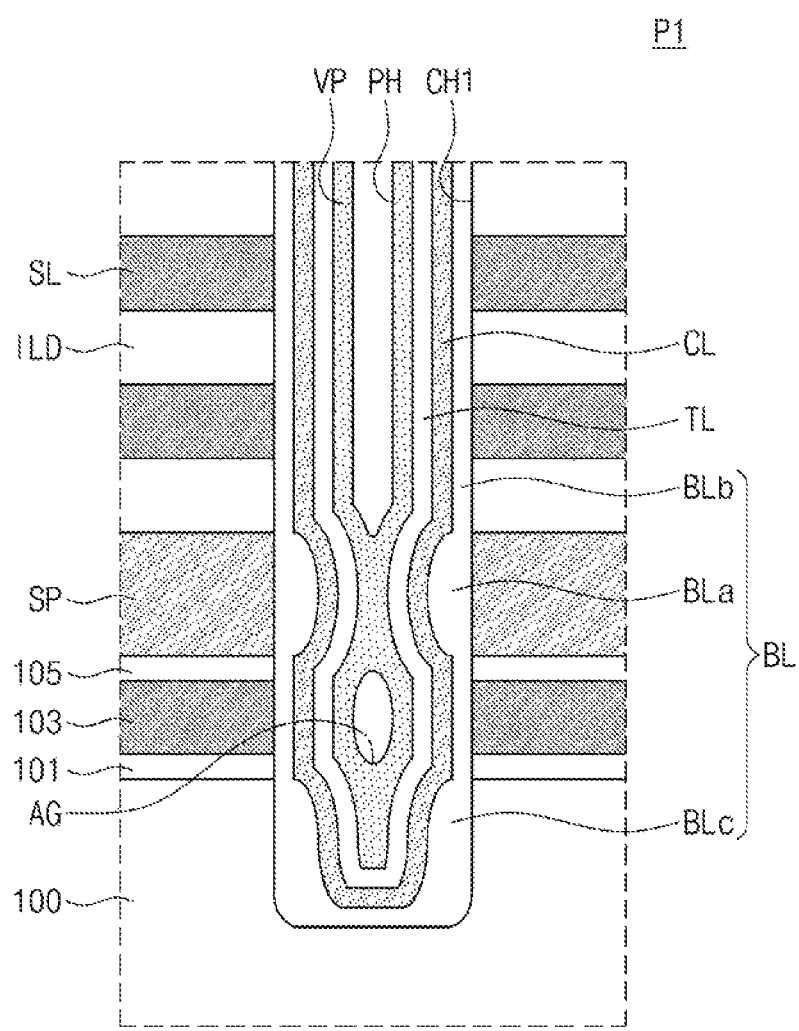

Referring to FIG. 19, a vertical channel layer VP may be deposited to have a thickness that is not enough to completely fill the channel hole CH1 throughout its entirety.

In a portion, however, the vertical channel layer VP may be deposited to have a thickness greater than a minimum radius of the remaining opening of the channel hole CH1 in which the data storage layer (BL, CL, and TL) is formed. Thus, because the channel hole CH1 has a small diameter at its portion around the support semiconductor pattern SP, when the vertical channel layer VP is deposited, the portion around the support semiconductor pattern SP may be filled with the vertical channel layer VP.

In another portion, however, a lower portion of the channel hole CH1 may not be completely filled. Thus, an air gap AG may be formed in a lower portion (see also LP of FIG. 7) of the vertical channel layer VP. For example, the air gap AG may be formed at a lower level than that of the support semiconductor pattern SP.

In various implementations, the vertical channel layer VP may be formed as, e.g., a polycrystalline silicon layer, a single-crystalline silicon layer, or an amorphous silicon layer.

Subsequently, an annealing process may be performed on the vertical channel layer VP. The annealing process may recrystallize the vertical channel layer VP. Thus, the vertical channel layer VP may have a reduced number of grain boundaries. The annealing process may include a hydrogen annealing process performed under gas environment including hydrogen or deuterium.

The vertical channel layer VP may define a pinhole section PH in the channel hole CH1. The pinhole section PH may be defined on an upper portion (see UP of FIG. 7) of the vertical channel layer VP. In the channel hole CH1, the vertical channel layer VP may fill, e.g., completely, the portion of the channel hole CH1 that is adjacent to the support semiconductor pattern SP.

Figure 20:
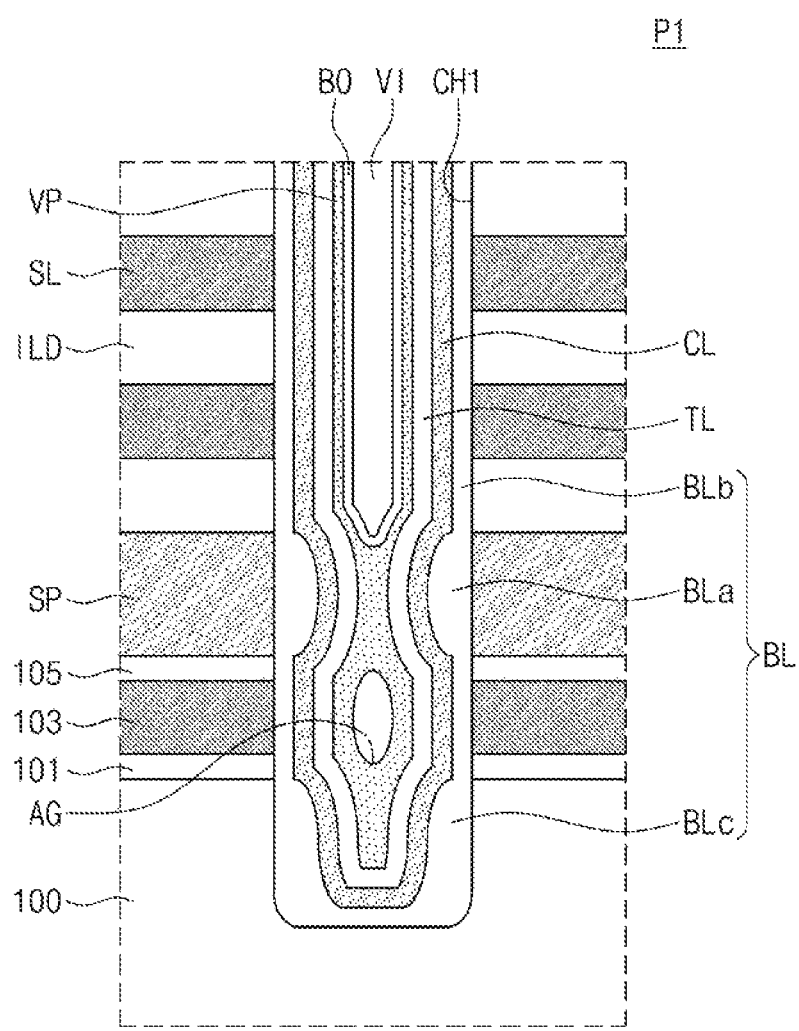

Referring to FIG. 20, an isotropic etching process may be performed to decrease a thickness of the vertical channel layer VP that is exposed in the pinhole section PH. The isotropic etching process may use, e.g., one or more of $NH_4OH$, SC1, and HC1 as an etchant. Thus, the thickness of the portion of the vertical channel layer VP that is exposed in the pinhole section PH may be reduced.

Subsequently, a barrier layer BO and a gap-fill dielectric layer VI may be sequentially formed in the pinhole section PH of the vertical channel layer VP. The barrier layer BO and the gap-fill dielectric layer VI may include at least one selected from a silicon oxide layer, a silicon oxynitride layer, and a silicon nitride layer, and the barrier layer BO may include carbon.

Figure 21:
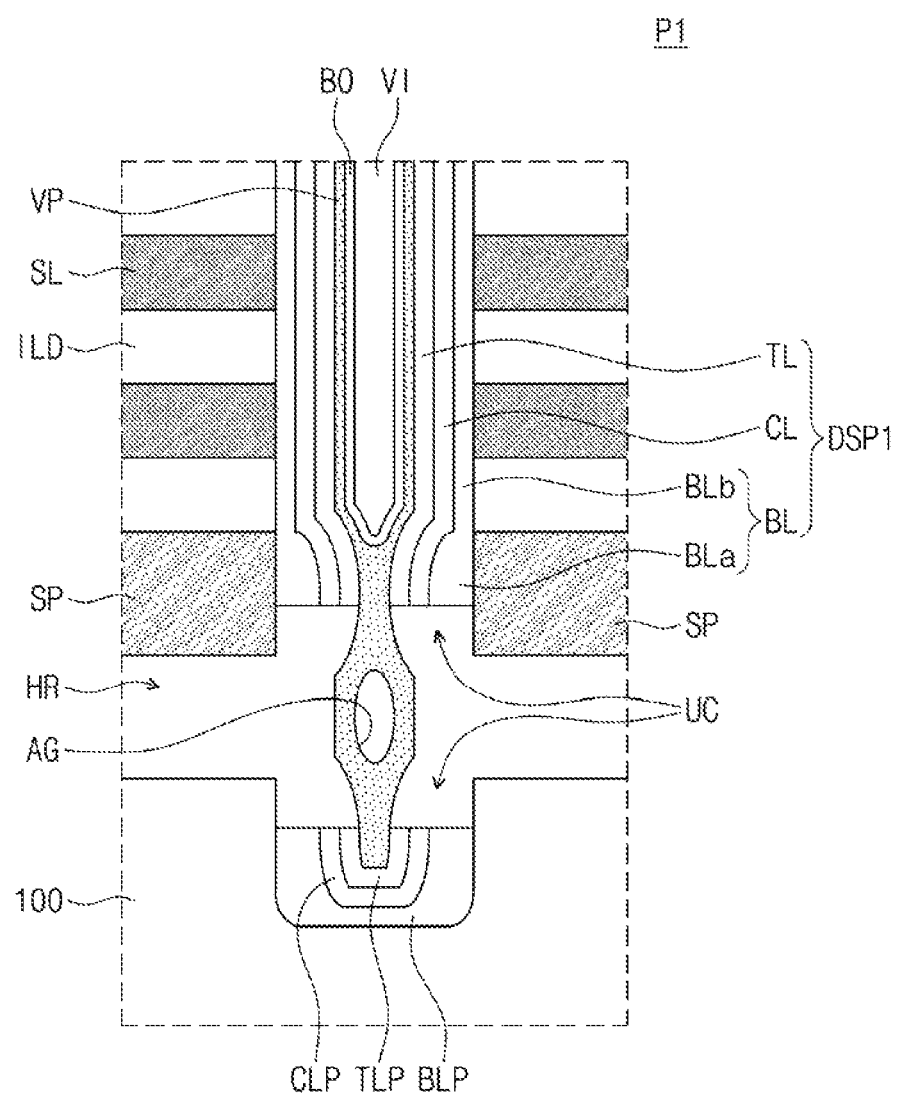

Referring to FIG. 21, after the formation of the sacrificial spacer 133 (discussed with reference to FIG. 15A), the first, second, and third dielectric layers 101, 103, and 105 may undergo an isotropic etching process to form a horizontal recess HR that exposes a portion of the data storage layer (BL, CL, and TL). In the isotropic etching process, the horizontal recess HR may be etched with an etch recipe having an etch selectivity with respect to the sacrificial spacer 133 and the data storage layer (BL, CL, and TL). The horizontal recess HR may be an empty space between the support semiconductor pattern SP and the semiconductor layer 100. The horizontal recess HR may expose a portion of the data storage layer (BL, CL, and TL) between the support semiconductor pattern SP and the semiconductor layer 100.

The blocking dielectric layer BL, the charge storage layer CL, and the tunnel dielectric layer TL that are exposed to the horizontal recess HR may undergo the isotropic etching process to form an undercut UC that partially exposes the vertical channel layer VP. The undercut UC may be an empty space that vertically extends from the horizontal recess HR, and may be defined between the vertical channel layer VP and a sidewall of the support semiconductor pattern SP and between the vertical channel layer VP and the semiconductor layer 100.

The formation of the undercut UC may form thereabove a first data storage pattern DSP1 (referred to in brief hereinafter a data storage pattern), while below, in the semiconductor layer 100, the blocking dielectric layer BL, the charge storage layer CL, and the tunnel dielectric layer TL may partially remain to form a residual blocking pattern BLP, a residual charge pattern CLP, and a residual tunnel pattern TLP.

The isotropic etching process that forms the undercut UC may include sequentially performing a first etching process that etches a portion of the blocking dielectric layer BL, a second etching process that etches a portion of the charge storage layer CL, and a third etching process that etches a portion of the tunnel dielectric layer TL. An etchant including hydrofluoric acid or sulfuric acid may be used in the first and third etching processes, and an etchant including phosphoric acid may be used in the second etching process.

The formation of the undercut UC may define a bottom surface of the data storage pattern DSP1. The bottom surface of the data storage pattern DSP1 may have a level that depends on the isotropic etching process performed on the data storage layer (BL, CL, and TL).

In an implementation (not shown in FIG. 21 but see FIG. 8), during the formation of the undercut UC, the lower portion (LP of FIG. 8) of the vertical channel layer VP may be partially etched to expose the air gap AG (see FIG. 8). Even in this case, the vertical channel layer VP may fill a portion of the channel hole CH1 adjacent to the support semiconductor pattern SP, and thus no source gas may migrate upwards over the support semiconductor pattern SP.

Figure 22:
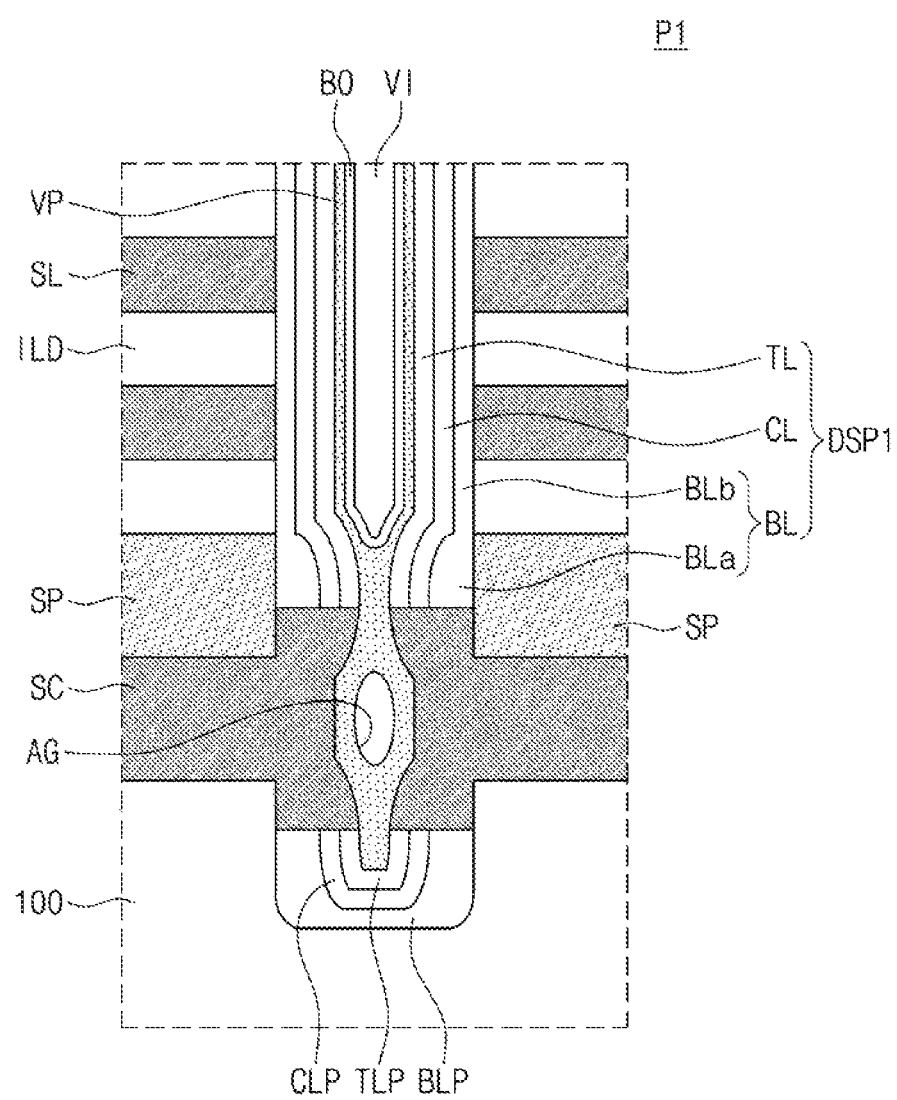

Referring to FIG. 22, a source semiconductor pattern SC may be formed in the undercut UC and the horizontal recess HR. The source semiconductor pattern SC may be formed by, e.g., using chemical vapor deposition (CVD) or atomic layer deposition (ALD). The source semiconductor pattern SC may be a semiconductor layer doped with impurities, e.g., n-type impurities. An impurity concentration of the source semiconductor pattern SC may be greater than that of the support semiconductor pattern SP.

In an implementation (again not shown in FIG. 22 but see again FIG. 8), when the portion of the vertical channel layer VP is etched to expose the air gap AG, the source semiconductor pattern SC may fill the air gap AG at the lower portion (LP of FIG. 8) of the vertical channel layer VP.

Figure 23:
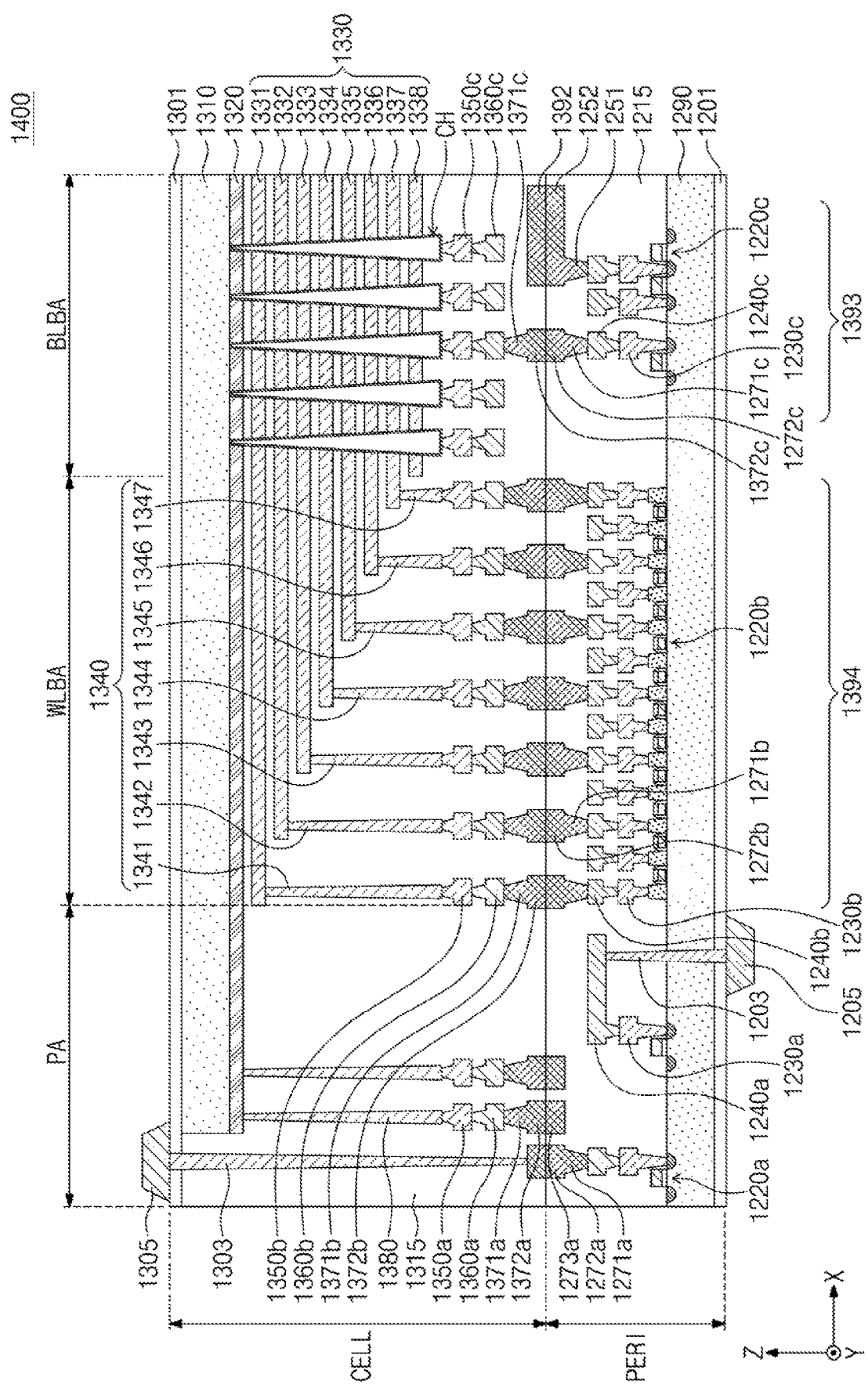
FIG. 23 illustrates a cross-sectional view showing a semiconductor device according to an example embodiment.

FIG. 23 illustrates a cross-sectional view showing a semiconductor device according to an example embodiment.

According to the embodiment of FIG. 23, differently from the embodiments discussed above, a bonding method may be used to electrically connect a peripheral circuit structure to a cell array structure.

Referring to FIG. 23, a semiconductor device 1400 may have a chip-to-chip (C2C) structure. The chip-to-chip (C2C) structure may be fabricated by forming on a first wafer an upper chip including a cell array structure CELL; forming, on a second wafer different from the first wafer, a lower chip including a peripheral circuit structure PERI; and then using a bonding method to connect the upper and lower chips to each other. For example, the bonding method may indicate a way that electrically connects a bonding metal formed on an uppermost metal layer of the upper chip to a bonding metal formed on an uppermost metal layer of the lower chip. For example, when the bonding metal is formed of copper (Cu) the bonding method may be a Cu-to-Cu bonding method, or the bonding metal may be formed of, e.g., aluminum (Al) or tungsten (W). Each of the peripheral circuit structure PERI and the cell array structure CELL of the semiconductor device 1400 may include an outer pad bonding region PA, a word-line bonding region WLBA, and a bit-line bonding region BLBA.

The peripheral circuit structure PERI may include a first substrate 1290, an interlayer dielectric layer 1215, a plurality of circuit elements 1220a, 1220b, and 1220c formed on the first substrate 1290, first metal layers 1230a, 1230b, and 1230c respectively connected to the plurality of circuits elements 1220a, 1220b, and 1220c, and second metal layers 1240a, 1240b, and 1240c respectively formed on the first metal layers 1230a, 1230b, and 1230c. The first metal layers 1230a, 1230b, and 1230c may be formed of tungsten whose electrical resistivity is relatively higher, and the second metal layers 1240a, 1240b, and 1240c may be formed of copper whose electrical resistivity is relatively lower.

The first metal layers 1230a, 1230b, and 1230c and the second metal layers 1240a, 1240b, and 1240c are illustrated and explained in this description, but one or more metal layers may further be formed on the second metal layers 1240a, 1240b, and 1240c. At least one of the metal layers formed on the second metal layers 1240a, 1240b, and 1240c may be formed of aluminum whose electrical resistivity is less than that of copper used for forming the second metal layers 1240a, 1240b, and 1240c.

The interlayer dielectric layer 1215 may be disposed on the first substrate 1290 so as to cover the plurality of circuit elements 1220a, 1220b, and 1220c, the first metal layers 1230a, 1230b, and 1230c, and the second metal layers 1240a, 1240b, and 1240c, and may include a dielectric material such as silicon oxide or silicon nitride.

A lower bonding metal 1271b and 1272b may be formed on the second metal layer 1240b of the word-line bonding region WLBA. On the word-line bonding region WLBA, the lower bonding metal 1271b and 1272b of the peripheral circuit structure PERI may be electrically bonded and connected to an upper bonding metal 1371b and 1372b of the cell array structure CELL, and the lower bonding metal 1271b and 1272b and the upper bonding metal 1371b and 1372b may be formed of aluminum, copper, or tungsten.

The cell array structure CELL may provide at least one memory block. The cell array structure CELL may have characteristics substantially the same as those of the cell array structures in the embodiments discussed above. The cell array structure CELL may include a first cell block and a second cell block in the embodiments discussed above. The cell array structure CELL may include a second substrate 1310 and a common source line 1320. The second substrate 1310 may be provided thereon with a plurality of word lines 1330 (or 1331 to 1338) along a direction (Z-axis direction) perpendicular to a top surface of the second substrate 1310. String selection lines and a ground selection line may be respectively located on upper and lower portions of the word lines 1330, and the plurality of word lines 1330 may be located between the string selection lines and the ground selection line.

On the bit-line bonding region BLBA, a channel structure CH may extend in the direction (Z-axis direction) perpendicular to the top surface of the second substrate 1310, and may penetrate the word lines 1330, the string selection lines, and the ground selection line. The channel structure CH may have characteristics substantially the same as those of the vertical structures discussed above. The channel structure CH may include a data storage layer, a channel layer, and a buried dielectric layer, and the channel layer may be electrically connected to a first metal layer 1350c and a second metal layer 1360c. For example, the first metal layer 1350c may be a bit-line contact, and the second metal layer 1360c may be a bit line. The bit line 1360c may extend along a first direction (Y-axis direction) parallel to a top surface of the second substrate 1310.

Referring to FIG. 23, the bit-line bonding region BLBA may be defined to refer to a zone where the channel structure CH and the bit line 1360c are located. On the bit-line bonding region BLBA, the bit lines 1360c may be electrically connected to the circuit elements 1220c that provide a page buffer 1393 on the peripheral circuit structure PERI. For example, the bit line 1360c may have connection with an upper bonding metal 1371c and 1372c on the peripheral circuit structure PERI, and the upper bonding metal 1371c and 1372c may have connection with a lower bonding metal 1271c and 1272c connected to the circuit elements 1220c of the page buffer 1393.

On the word-line bonding region WLBA, the word lines 1330 may extend along a second direction (X-axis direction) parallel to the top surface of the second substrate 1310 while being perpendicular to the first direction (Y-axis direction), and may be connected to a plurality of cell contact plugs 1340 (or 1341 to 1347). The word lines 1330 and the cell contact plugs 1340 may be connected at pads that are at least portions of the word lines 1330 and that extend to have different lengths along the second direction (X-axis direction). The first metal layer 1350b and the second metal layer 1360b may be sequentially connected to upper portions of the cell contact plugs 1340 connected to the word lines 1330. On the word-line bonding region WLBA, the cell contact plugs 1340 may be connected to the peripheral circuit structure PERI through the upper bonding metal 1371b and 1372b of the cell array structure CELL and through the lower bonding metal 1271b and 1272b of the peripheral circuit structure PERI.

The cell contact plugs 1340 may be electrically connected to the circuit elements 1220b that form a row decoder 1394 on the peripheral circuit structure PERI. An operating voltage of the circuit elements 1220b that form the row decoder 1394 may be different from that of the circuit elements 1220c that form the page buffer 1393. For example, the operating voltage of the circuit elements 1220c that form the page buffer 1393 may be greater than that of the circuit elements 1220b that form the row decoder 1394.

A common source line contact plug 1380 may be disposed on an outer pad bonding region PA. The common source line contact plug 1380 may be formed of a conductive material, such as metal, metal compound, or polysilicon, and may be electrically connected to the common source line 1320. The first metal layer 1350a and the second metal layer 1360a may be sequentially stacked on an upper portion of the common source line contact plug 1380. For example, the outer pad bonding region PA may be defined to refer to an area on which are disposed the common source line contact plug 1380, the first metal layer 1350a, and the second metal layer 1360a.

Input/output pads 1205 and 1305 may be disposed on the outer pad bonding region PA. Referring to FIG. 23, a lower dielectric layer 1201 may be formed to cover a bottom surface of the first substrate 1290, and a first input/output pad 1205 may be formed on the lower dielectric layer 1201. The first input/output pad 1205 may be connected through a first input/output contact plug 1203 to at least one of the plurality of circuit elements 1220a, 1220b, and 1220c disposed on the peripheral circuit structure PERI, and the lower dielectric layer 1201 may separate the first input/output pad 1205 from the first substrate 1290. A sidewall dielectric layer (not shown in FIG. 23) may be disposed between the first input/output contact plug 1203 and the first substrate 1290, and may electrically separate the first input/output contact plug 1203 from the first substrate 1290.

An upper dielectric layer 1301 may be formed to cover a top surface of the second substrate 1310. A second input/output pad 1305 may be disposed on the upper dielectric layer 1301. The second input/output pad 1305 may be connected through a second input/output contact plug 1303 to at least one of the plurality of circuit elements 1220a, 1220b, and 1220c disposed on the peripheral circuit structure PERI. The second input/output pad 1305 may be electrically connected to the circuit element 1220a.

In an implementation, neither the second substrate 1310 nor the common source line 1320 may be located on an area where the second input/output contact plug 1303 is disposed. In addition, the second input/output pad 1305 may not overlap in the third direction (Z-axis direction) with the word lines 1330. Referring to FIG. 23, when viewed in a direction perpendicular to the top surface of the second substrate 1310, the second input/output contact plug 1303 may be separated from the second substrate 1310, and may penetrate an interlayer dielectric layer 1315 of the cell array structure CELL to come into connection with the second input/output pad 1305.

The first input/output pad 1205 and the second input/output pad 1305 may be selectively formed. For example, the semiconductor device 1400 may include only the first input/output pad 1205 disposed on an upper portion of the first substrate 1290, or only the second input/output pad 1305 disposed on an upper portion of the second substrate 1310. For another example, the semiconductor device 1400 may include all of the first input/output pad 1205 and the second input/output pad 1305.

On each of the outer pad bonding region PA and the bit-line bonding region BLBA that are included in each of the cell array structure CELL and the peripheral circuit structure PERI, a metal pattern at an uppermost metal layer may be present as a dummy pattern, or the uppermost metal layer may be absent.

The semiconductor device 1400 may be configured such that, on the outer pad bonding region PA, a lower metal pattern 1273a may be formed to correspond to an upper metal pattern 1372a formed at an uppermost metal layer of the cell array structures CELL, and that the lower metal pattern 1273a may have the same shape as that of the upper metal pattern 1372a. The lower metal pattern 1273a formed at the uppermost metal layer of the peripheral circuit structure PERI may not be connected to a separate contact on the peripheral circuit structure PERI. Similarly, on the outer pad bonding region PA, an upper metal pattern 1372a may be formed at an upper metal layer of the cell array structure CELL, which upper metal pattern 1372a may correspond to and have the same shape as that of the lower metal pattern 1273a formed at an uppermost metal layer of the peripheral circuit structure PERI.

A lower bonding metal 1271b and 1272b may be formed on the second metal layer 1240b of the word-line bonding region WLBA. On the word-line bonding region WLBA, the lower bonding metal 1271b and 1272b of the peripheral circuit structure PERI may be bonded to and electrically connected to the upper bonding metal 1371b and 1372b of the cell array structure CELL.

On the bit-line bonding region BLBA, an upper metal pattern 1392 may be formed at an uppermost metal layer of the cell array structure CELL, which upper metal pattern 1392 may correspond to and have the same shape as that of a lower metal pattern 1252 formed at an uppermost metal layer of the peripheral circuit structure PERI. No contact may be formed on the upper metal pattern 1392 formed at the uppermost metal layer of the cell array structure CELL.

As described above, a vertical channel pattern may have a gourd-shaped structure, and thus it may be possible to prevent introduction of n-type impurities into the vertical channel pattern when forming a source semiconductor pattern doped with n-type impurities. Embodiments may provide a semiconductor device with improved reliability and electrical characteristics. Embodiments may also provide an electronic system including the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a stack structure that includes electrodes vertically stacked on a semiconductor layer;
a source semiconductor pattern between the semiconductor layer and the stack structure;
a support semiconductor pattern between the stack structure and the source semiconductor pattern; and
a vertical structure penetrating the stack structure, the support semiconductor pattern, and the source semiconductor pattern, the vertical structure includes:

a vertical channel pattern in which a part of a sidewall is in contact with the source semiconductor pattern and a data storage pattern surrounding the sidewall of the vertical channel pattern;
a gap-fill dielectric pattern; and
a barrier layer surrounding the gap-fill dielectric pattern, wherein:
the vertical channel pattern includes:
an upper portion adjacent to the stack structure;
a lower portion adjacent to the source semiconductor pattern; and
a middle portion adjacent to the support semiconductor pattern,
the upper portion has a first diameter,
the lower portion has a second diameter, and
the middle portion has a third diameter less than the first diameter and the second diameter,
wherein the data storage pattern includes a blocking dielectric layer that continuously extends from a sidewall of the support semiconductor pattern to a sidewall of the stack structure,
wherein the blocking dielectric layer has a first thickness on the sidewall of the support semiconductor pattern and a second thickness on the sidewall of the stack structure, the first thickness being greater than the second thickness,
wherein the sidewall of the support semiconductor pattern is vertically aligned with the sidewall of the stack structure,
wherein the gap-fill dielectric pattern penetrates the upper portion of the vertical channel pattern,
wherein the barrier layer is disposed between the upper portion of the vertical channel pattern and the gap-fill dielectric pattern, and
wherein the barrier layer contacts the middle portion of the vertical channel pattern.

2. The semiconductor device as claimed in claim 1, wherein the vertical channel pattern has a minimum diameter located at a level between top and bottom surfaces of the support semiconductor pattern.

3. The semiconductor device as claimed in claim 1, wherein the middle portion of the vertical channel pattern has a rounded sidewall profile.

4. The semiconductor device as claimed in claim 1, wherein:
a bottom surface of the gap-fill dielectric pattern is vertically spaced apart from a top surface of the source semiconductor pattern.

5. The semiconductor device as claimed in claim 4, wherein:
the vertical channel pattern has a minimum diameter located at the middle portion, and
the minimum diameter of the vertical channel pattern is greater than a thickness of the vertical channel pattern between the gap-fill dielectric pattern and a sidewall of the stack structure.

6. The semiconductor device as claimed in claim 1, wherein:
the upper portion of the vertical channel pattern has a pipe shape with a closed bottom end, and
the middle portion of the vertical channel pattern has a pillar shape.

7. The semiconductor device as claimed in claim 1, wherein the lower portion of the vertical channel pattern includes an air gap.

8. The semiconductor device as claimed in claim 1, wherein:

the vertical structure further includes a data storage pattern on the source semiconductor pattern, the data storage pattern surrounding the sidewall of the vertical channel pattern,
the data storage pattern includes:
a first portion between a sidewall of the stack structure and the upper portion of the vertical channel pattern; and
a second portion between a sidewall of the support semiconductor pattern and the middle portion of the vertical channel pattern, a thickness of the second portion being greater than a thickness of the first portion.

9. The semiconductor device as claimed in claim 1, wherein:
the source semiconductor pattern includes:
a horizontal portion between the support semiconductor pattern and the semiconductor layer, the horizontal portion being parallel to the stack structure; and
a sidewall portion vertically protruding from the horizontal portion, the sidewall portion being between the vertical channel pattern and a sidewall of the support semiconductor pattern and between the vertical channel pattern and the semiconductor layer, and
the sidewall portion has a width that progressively increases in a direction perpendicular to a top surface of the semiconductor layer.

10. The semiconductor device as claimed in claim 1, wherein:
the vertical channel pattern further includes a bottom portion below a top surface of the semiconductor layer and connected to the lower portion, and
the bottom portion has a fourth diameter that is less than the first diameter and the second diameter.

11. The semiconductor device as claimed in claim 1, wherein the support semiconductor pattern and the source semiconductor pattern each include a semiconductor material doped with impurities having a first conductivity type, a concentration of the impurities in the source semiconductor pattern being greater than a concentration of the impurities in the support semiconductor pattern.

12. A semiconductor device, comprising:
a stack structure including electrodes vertically stacked on a semiconductor layer;
a source semiconductor pattern between the semiconductor layer and the stack structure;
a support semiconductor pattern between the stack structure and the source semiconductor pattern; and
a vertical structure penetrating the stack structure, the support semiconductor pattern, and the source semiconductor pattern, the vertical structure including:
a vertical channel pattern in which a part of a sidewall is in contact with the source semiconductor pattern;
a data storage pattern on the source semiconductor pattern, the data storage pattern surrounding the sidewall of the vertical channel pattern and including a first portion and a second portion, the first portion being between the vertical channel pattern and a sidewall of the support semiconductor pattern, and the second portion being between the vertical channel pattern and a sidewall of the stack structure, a thickness of the first portion being greater than a thickness of the second portion;
a gap-fill dielectric pattern penetrating an upper portion of the vertical channel pattern; and
a barrier layer surrounding the gap-fill dielectric pattern, wherein the sidewall of the support semiconductor pattern is vertically aligned with the sidewall of the stack structure, wherein the data storage pattern continuously extends from the sidewall of the support semiconductor pattern to the sidewall of the stack structure, wherein the barrier layer is disposed between the upper portion of the vertical channel pattern and the gap-fill dielectric pattern, and wherein the barrier layer contacts a middle portion of the vertical channel pattern.

13. The semiconductor device as claimed in claim 12, wherein a bottom surface of the gap-fill dielectric pattern being vertically spaced apart from a top surface of the source semiconductor pattern.

14. The semiconductor device as claimed in claim 13, wherein the second portion of the data storage pattern is between the gap-fill dielectric pattern and the sidewall of the stack structure.

15. The semiconductor device as claimed in claim 12, wherein:

the data storage pattern includes a tunnel dielectric layer, a charge storage layer, and a blocking dielectric layer that are sequentially stacked on the sidewall of the vertical channel pattern, and the blocking dielectric layer has a first thickness on the sidewall of the support semiconductor pattern and a second thickness on the sidewall of the stack structure, the first thickness being greater than the second thickness.

16. The semiconductor device as claimed in claim 12, wherein the vertical channel pattern has a minimum diameter located at a portion adjacent to the support semiconductor pattern, and a thickness of the vertical channel pattern on the second portion of the data storage pattern is less than the minimum diameter.

* * * * *